US011031494B2

(12) United States Patent
Meiser

(10) Patent No.: US 11,031,494 B2
(45) Date of Patent: Jun. 8, 2021

(54) SILICON CARBIDE SEMICONDUCTOR DEVICE HAVING A GATE ELECTRODE FORMED IN A TRENCH STRUCTURE

(71) Applicant: Infineon Technologies AG, Neubiberg (DE)

(72) Inventor: Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 16/280,775

(22) Filed: Feb. 20, 2019

(65) Prior Publication Data

US 2019/0259870 A1 Aug. 22, 2019

(30) Foreign Application Priority Data

Feb. 21, 2018 (DE) .......................... 102018103849.6

(51) Int. Cl.
*H01L 29/78* (2006.01)
*H01L 21/765* (2006.01)
(Continued)

(52) U.S. Cl.
CPC ........ *H01L 29/7806* (2013.01); *H01L 21/049* (2013.01); *H01L 21/0465* (2013.01);
(Continued)

(58) Field of Classification Search
CPC ............. H01L 29/7806; H01L 29/1608; H01L 21/0495; H01L 21/049; H01L 21/0475;
(Continued)

(56) References Cited

U.S. PATENT DOCUMENTS 8,704,295 B1* 4/2014 Darwish ........... H01L 29/66727
257/330
2006/0214222 A1* 9/2006 Challa ............... H01L 21/31116
257/328
(Continued)

FOREIGN PATENT DOCUMENTS

DE 202004021424 U1 2/2008

OTHER PUBLICATIONS

Hsu, Fu-Jen, et al., "High Efficiency High Reliability SiC MOSFET with Monolithically Integrated Schottky Rectifier", Proceedings of the 29th International Symposium on Power Semiconductor Devices & ICs, Sapporo, Japan, May 28-Jun. 1, 2017, pp. 45-48.
(Continued)

*Primary Examiner* — Charles D Garber
*Assistant Examiner* — S M Sohel Imtiaz
(74) *Attorney, Agent, or Firm* — Murphy, Bilak & Homiller, PLLC

(57) ABSTRACT

A semiconductor device includes a trench structure extending from a first surface into a semiconductor body composed of silicon carbide. The trench structure includes an electrode and between the electrode and the first surface a gate electrode. A shielding region adjoining the electrode forms a first pn junction with a drift structure formed in the semiconductor body. A Schottky contact is formed between the drift structure and a first contact structure.

23 Claims, 23 Drawing Sheets

(51) Int. Cl.
    H01L 29/10    (2006.01)
    H01L 29/40    (2006.01)
    H01L 29/423   (2006.01)
    H01L 29/47    (2006.01)
    H01L 29/739   (2006.01)
    H01L 29/66    (2006.01)
    H01L 21/04    (2006.01)
    H01L 29/16    (2006.01)

(52) U.S. Cl.
    CPC ...... *H01L 21/0475* (2013.01); *H01L 21/0495* (2013.01); *H01L 21/765* (2013.01); *H01L 29/1095* (2013.01); *H01L 29/1608* (2013.01); *H01L 29/401* (2013.01); *H01L 29/407* (2013.01); *H01L 29/4236* (2013.01); *H01L 29/47* (2013.01); *H01L 29/66068* (2013.01); *H01L 29/7391* (2013.01); *H01L 29/7397* (2013.01); *H01L 29/7813* (2013.01)

(58) Field of Classification Search
    CPC ........... H01L 21/0465; H01L 29/66068; H01L 29/401; H01L 29/7813; H01L 29/7397; H01L 29/7391; H01L 29/47; H01L 29/4236; H01L 29/407; H01L 29/1095; H01L 29/41766; H01L 29/0696; H01L 29/0623; H01L 21/0485; H01L 29/872
    See application file for complete search history.

(56) References Cited

U.S. PATENT DOCUMENTS

| | | | | |
|---|---|---|---|---|
| 2007/0221952 | A1* | 9/2007 | Thorup | H01L 29/66734 257/155 |
| 2009/0294859 | A1* | 12/2009 | Hshieh | H01L 29/1095 257/368 |
| 2011/0068386 | A1* | 3/2011 | Tai | H01L 29/4236 257/328 |
| 2012/0319132 | A1* | 12/2012 | Bhalla | H01L 29/7813 257/77 |
| 2012/0319199 | A1* | 12/2012 | Zeng | H01L 29/66727 257/334 |
| 2013/0137230 | A1* | 5/2013 | Blank | H01L 29/7813 438/270 |
| 2013/0240987 | A1* | 9/2013 | Hirler | H01L 29/66727 257/331 |
| 2015/0349113 | A1* | 12/2015 | Katoh | H01L 29/0696 257/331 |
| 2015/0380543 | A1* | 12/2015 | Zink | H01L 21/76202 257/334 |
| 2016/0079238 | A1* | 3/2016 | Siemieniec | H01L 29/7806 257/140 |
| 2016/0181408 | A1* | 6/2016 | Aichinger | H01L 29/4238 257/77 |
| 2016/0190301 | A1* | 6/2016 | Aichinger | H01L 27/0207 257/77 |
| 2016/0260829 | A1* | 9/2016 | Aichinger | H01L 29/417 |
| 2016/0359029 | A1* | 12/2016 | Zeng | H01L 29/0834 |
| 2018/0138299 | A1* | 5/2018 | Naito | H01L 29/4238 |

OTHER PUBLICATIONS

Jiang, Huaping, et al., "SiC MOSFET with Built-in SBD for Reduction of Reverse Recovery Charge and Switching Loss in 10-kV Applications", Proceedings of the 29th International Symposium on Power Semiconductor Devices & ICs, Sapporo, Japan, May 28-Jun. 1, 2017, pp. 49-52.

Kawahara, Koutarou, et al., "6.5 kV Schottky-Barrier-Diode-Embedded SiC-MOSFET for Compact Full-Unipolar Module", Proceedings of the 29th International Symposium on Power Semiconductor Devices & ICs, Sapporo, Japan, May 28-Jun. 1, 2017, pp. 41-44.

\* cited by examiner

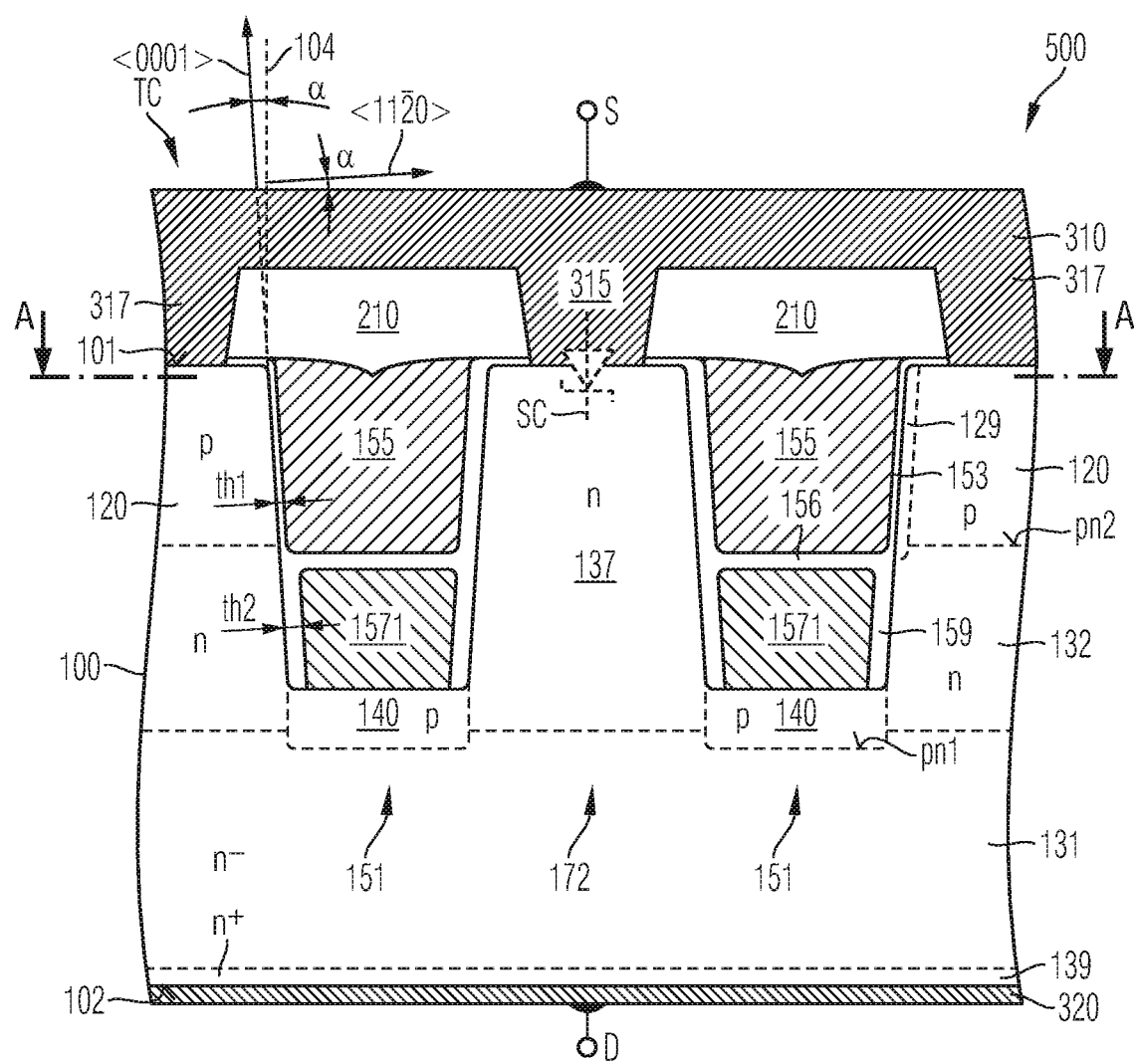

SILICON CARBIDE SEMICONDUCTOR DEVICE HAVING A GATE ELECTRODE FORMED IN A TRENCH STRUCTURE

TECHNICAL FIELD

The present application relates to SiC (silicon carbide) semiconductor devices, for example semiconductor switches having a low on resistance and a high dielectric strength.

BACKGROUND

Power semiconductor devices carry a comparatively high load current in conjunction with a high dielectric strength. In power semiconductor devices having a vertical structure, the load current flows between two mutually opposite main surfaces of a semiconductor body, such that the current-carrying capacity can be set by the horizontal extent of the semiconductor body and the dielectric strength over the vertical extent of a drift zone formed in the semiconductor body. In power semiconductor switches such as MOSFETs (metal oxide semiconductor field effect transistors) and IGBTs (insulated gate bipolar transistors), a gate electrode couples into body regions capacitively via a gate dielectric and switches the load current by temporarily forming an inversion channel in the body regions. If the gate electrode is part of a trench structure, then in semiconductor bodies composed of a metal having an intrinsically high breakdown field strength, such as silicon carbide, for example, the gate dielectric is subjected to a strong electric field in the off-state case, and so the breakdown strength of the gate dielectric prescribes up to what voltage the dielectric strength of the semiconductor switch can be set by the vertical extent of the drift zone.

It is generally endeavored to improve the dielectric strength of semiconductor devices and also the avalanche strength thereof without losses with regard to the on resistance.

SUMMARY

The present disclosure relates to a semiconductor device comprising a trench structure. The trench structure extends from a first surface into a semiconductor body composed of silicon carbide. An electrode and between the electrode and the first surface a gate electrode are formed within the trench structure. A shielding region adjoins the electrode, said shielding region forming a first pn junction with a drift structure formed in the semiconductor body. A Schottky contact is formed between the drift structure and a first contact structure.

The shielding region can be connected via a low-impedance path to a first load electrode on a front side defined by the first surface. The shielding region shields the trench structure including a gate dielectric against a potential of a second load electrode, which can be formed along a second surface of the semiconductor body, said second surface being situated opposite the first surface.

By virtue of the position below the gate electrode, the shielding region can pin an avalanche breakdown in the region of the first pn junction. If an avalanche breakdown occurs in the region of the first pn junction, then a charge carrier flow is carried away via the electrode and outside the crystalline semiconductor body to the first load electrode, such that the charge carrier flow cannot act as a base current of a parasitic npn bipolar transistor, the emitter current of which can lead to locally critical current densities.

The Schottky contact is formed by an interface between a semiconductor material of the drift structure and a partial layer of the first contact structure, said partial layer being formed from a metal, a metal compound or a metal alloy, wherein the doping of the drift structure along the interface and the work function of the material of the first partial layer are chosen such that a depletion zone forms in the semiconductor material in the case of equilibrium along the interface. The first contact structure can be electrically connected to the first load electrode via a low-impedance path; by way of example, the first contact structure can directly adjoin the first load electrode.

The Schottky contact can have a lower forward voltage than the first pn junction, such that in the reverse-biased state of the semiconductor device, by far the majority of the current through the semiconductor body flows through the Schottky contact and not via the first pn junction. Therefore, it is possible to suppress or at least largely to suppress a bipolar charge carrier flow via the first pn junction and thus to avoid a bipolar degradation of the semiconductor crystal in the drift structure.

According to one embodiment, sections of the Schottky contact SC can be formed between adjacent sections of the trench structure, as a result of which the reverse current can be distributed uniformly over the entire horizontal cross section of the semiconductor body.

The Schottky contact can be formed at a vertical distance from the first surface, wherein the vertical distance can be less than a vertical distance between a lower edge of the shielding region and the first surface, such that for example if the sections of the Schottky contact are formed between adjacent sections of the trench structure, the shielding effect of the shielding region can also extend to the Schottky contact.

The electrode can comprise connection regions extend from the first surface as far as a bottom of the trench structure and connect the sections of the electrode that are formed below the gate electrodes to second contact structures on the front side of the semiconductor body. The connection regions enable a uniformly low-impedance connection of the electrode over the entire horizontal cross section of the semiconductor device.

Sections of the gate electrode and connection regions of the electrode can alternate along a lateral longitudinal extent of a section of the trench structure, such that the ohmic resistance of the connection between shielding region and first load electrode can be kept small over the entire horizontal cross section of the semiconductor body.

In accordance with another embodiment, the trench structure comprises first sections and second sections, wherein the first sections extend along a lateral first direction and the second sections respectively connect two of the first sections which are adjacent to one another along a lateral second direction orthogonal to the first direction. The gate electrode is formed in the first sections. The second contact structures directly adjoin the connection regions of the electrode in the second sections, such that the shielding region over the entire semiconductor body can be connected to the first load electrode in each case locally with low impedance and in each case continuous, uninterrupted sections of the gate electrode are simultaneously formed in the first sections of the trench structure.

The first and second sections of the trench structure can laterally enclose first mesa sections and second mesa sections of the semiconductor body. Body regions can be formed in the first mesa sections, wherein the body regions can form second pn junctions with the drift structure. Sections of the Schottky contact can be formed in the second mesa sections.

The semiconductor device can comprise third contact structures adjoining the body regions. The first contact structures and the third contact structures can extend into the semiconductor body or be formed on the first surface.

The present disclosure furthermore relates to a semiconductor device comprising a trench structure extending from a first surface into a semiconductor body composed of silicon carbide. The trench structure comprises first sections and second sections, wherein the first sections extend along a lateral first direction and the second sections respectively connect two of the first sections which are adjacent to one another along a lateral second direction orthogonal to the first direction. An electrode and between the electrode and the first surface a gate electrode are formed in the first sections of the trench structure. Connection regions of the electrode are directly connected to a first load electrode in the second sections. The semiconductor device additionally comprises a shielding region, which directly adjoins the electrode and forms a first pn junction with a drift structure in the semiconductor body.

The electrode forms a part of a direct, low-impedance connection between the shielding region and the first load electrode. In the case of an avalanche breakdown at the first pn junction between the drift structure and the shielding region, the electrode carries away the current within the trench structure, such that no parasitic bipolar transistor in the semiconductor body can be turned on by the avalanche breakdown. The second sections are formed laterally alongside the first sections of the trench structure, such that the low-impedance connection between the electrode and the first load electrode does not interrupt the gate electrode in the first sections of the trench structure.

The first and second sections of the trench structure can laterally enclose mesa sections of the semiconductor body on four sides, wherein body regions are formed in the mesa sections, said body regions forming second pn junctions with the drift structure and third pn junctions with source regions formed between the first surface and the body regions. The shielding structure can enclose the mesa sections in each case laterally from all sides and effectively shield the mesa sections against the potential applied to the second load electrode.

The present disclosure furthermore relates to a method for producing a semiconductor device. A semiconductor substrate composed of silicon carbide is provided, into which a trench extends from a first main surface. The trench comprises first trench sections having a longitudinal extent along a lateral first direction and second trench sections extending transversely with respect to the first trench sections and connecting the first trench sections to one another. The trench exposes a shielding region, which forms a first pn junction with a drift structure formed in the semiconductor body. An electrode is formed, said electrode filling the second trench sections and a lower region of the first trench sections. A gate electrode is formed in an upper region of the first trench sections. In the second trench sections, the electrode can extend as far as the first main surface, and the gate electrode can be absent in the second trench sections.

Further features and advantages of the disclosed subject matter will become apparent to the person skilled in the art from the following detailed description and from the drawings.

BRIEF DESCRIPTION OF THE DRAWINGS

The accompanying drawings convey a deeper understanding of the invention, are included in the disclosure and form a part thereof. The drawings illustrate embodiments of the present invention and together with the description set out the principles of the invention. Further embodiments of the invention and intended advantages are evident from the understanding of the following detailed description.

FIG. 4C is a schematic vertical cross section through the semiconductor device section from FIG. 4A along the line C-C.

DETAILED DESCRIPTION

In the following detailed description, reference is made to the accompanying drawings, which form part of the disclosure and show specific exemplary embodiments of a semiconductor device and of a method for producing a semiconductor device for illustration purposes. It goes without saying that further exemplary embodiments exist. This likewise goes without saying that structural and/or logical changes can be made to the exemplary embodiments, without in so doing departing from what is defined by the patent claims. The description of the exemplary embodiments is non-limiting in this respect. In particular, features of exemplary embodiments described below can be combined with features of others of the exemplary embodiments described, provided that nothing to the contrary is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something to the contrary is clearly evident from the context.

Some figures represent relative dopant concentrations by the indication "−" or "+" next to the doping type. By way of example, the designation "n−" denotes a dopant concentration which is less than the dopant concentration of an "n"-doped region, while an "n+"-doped region has a higher dopant concentration than the "n"-doped region. The indication of the relative dopant concentration does not mean that doped regions with the same relative dopant concentration indication must have the same absolute dopant concentration, unless stated otherwise. Accordingly, two different "n"-doped regions can have the same or different absolute dopant concentrations.

If a value range with the indication of one limit value or two limit values is defined for a physical variable, then the prepositions "from" and "to" include the respective limit value. An indication of the type "from . . . to" is accordingly understood as "from at least . . . to at most".

Figure 1:
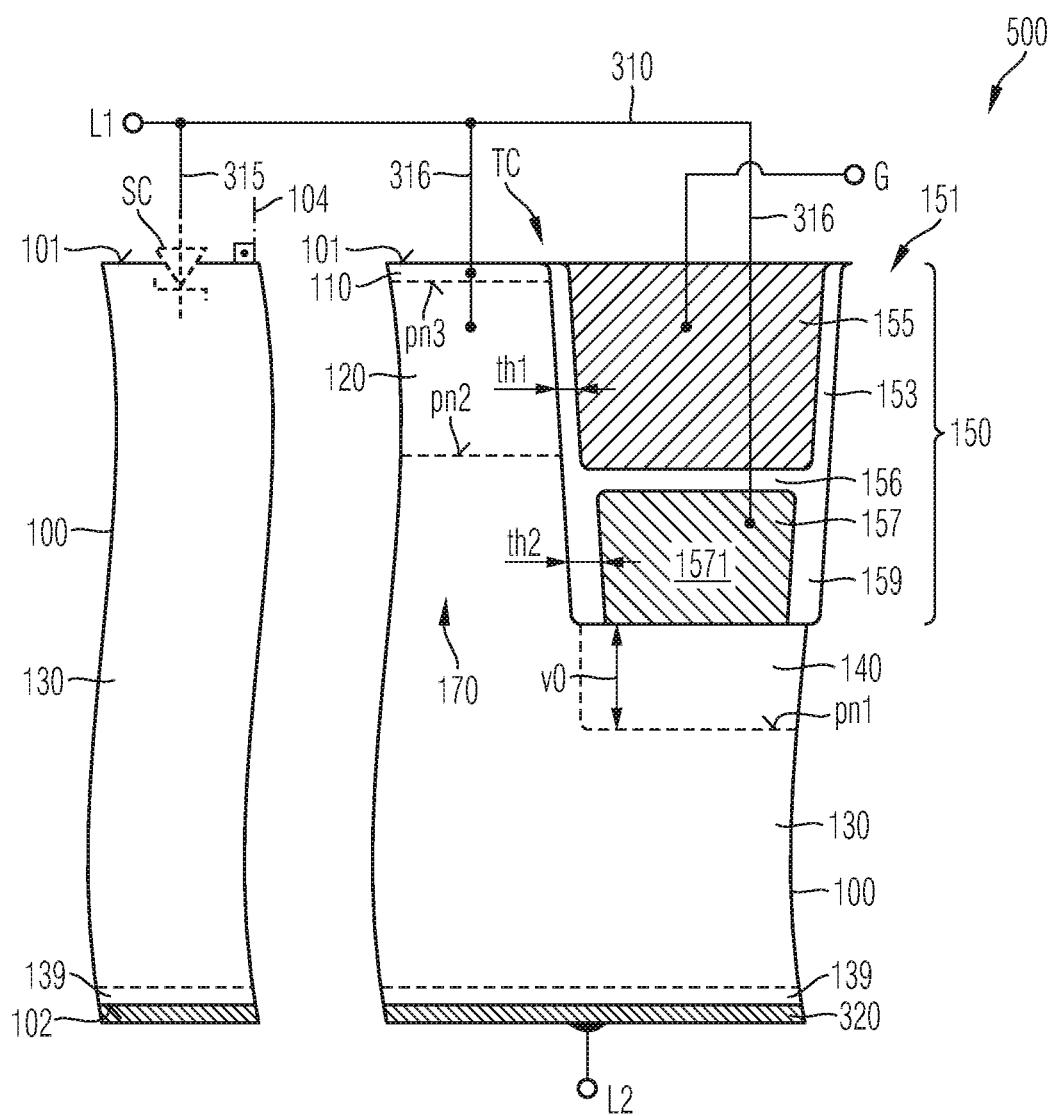
FIG. 1 is a schematic vertical cross section of a section of a semiconductor device comprising a shielding region connected via a trench structure and comprising a Schottky contact in accordance with one embodiment.

FIG. 1 relates to a semiconductor device 500 comprising transistor cells TC. The semiconductor device 500 can be an IGFET (insulated gate field effect transistor) or include such a transistor, wherein the IGFET can be a MOSFET in the customary meaning encompassing both FETs having metal gate electrodes and FETs having gate electrodes composed of a semiconductor material. The semiconductor device 500 can also be an IGBT or an MCD (MOS controlled diode).

The semiconductor device 500 comprises a semiconductor body 100 composed of silicon carbide. By way of example, the semiconductor body 100 comprises a silicon carbide crystal, which can comprise doping atoms and impurities, e.g. hydrogen and/or oxygen, besides the main constituents of silicon and carbon. In this case, the polytype of the SiC crystal can be 2H, 6H, 15R or 4H, for example. The transistor cells TC are formed along a first surface 101 on a front side of the semiconductor body 100. A drift structure 130 is formed between the transistor cells TC and a second surface 102, which is parallel to the first surface 101, on the rear side of the semiconductor body 100. Directions parallel to the first and second surfaces 101, 102 are lateral and horizontal directions. A normal 104 to the first surface 101 prescribes a vertical direction.

The drift structure 130 comprises at least one drift zone 131 of a conductivity type corresponding to a channel type of the transistor cells TC. By way of example, the drift zone 131 of a semiconductor device 500 comprising n-channel transistor cells TC is n-doped.

In the off-state case, by far the majority of the electric field effective in the semiconductor body 100 is dissipated within the drift zone 131. Doping and vertical extent of the drift zone 131 are designed in accordance with the nominal blocking capability of the semiconductor device 500. The average doping in the drift zone 131 lies for example in a range of from $5\times10^{15}$ cm$^{-3}$ to $5\times10^{16}$ cm$^{-3}$. The vertical extent of the drift zone 131 can lie in a range of from 3 μm to 10 µm for a semiconductor device 500 having a nominal breakdown voltage of 600 V and an average doping of approximately $2 \times 10^{16}$ cm$^{-3}$. The drift structure 130 can comprise a heavily doped base section 139 directly adjoining the second surface 102.

The base section 139 can directly adjoin the drift zone 131 or the drift structure 130 can comprise further doped regions of the conductivity type of the drift zone 131 between the drift zone 131 and the heavily doped base section 139, the average dopant concentration of said further doped regions being higher than that of the drift zone 131. Between the first surface 101 and the drift zone 131, the drift structure 130 can comprise further doped regions of the conductivity type of the drift zone 131, e.g. current distribution regions, which are doped more highly than the drift zone 131 and which, in the on state, spread the charge carrier flow for passage through the drift zone 131 in a lateral direction, and/or barrier regions, which locally influence, e.g. reduce, the emitter efficiency of body and/or shielding regions.

From the first surface 101, a trench structure 150 extends into the semiconductor body 100 and into the drift structure 130. A center-to-center distance between adjacent trench structures 150 can lie in a range of from 1 µm to 10 µm, for example in a range of from 2 µm to 5 µm. A vertical extent d1 of the trench structures 150 can lie in a range of from 300 nm to 5 µm for example in a range of from 500 nm to 2 µm. The trench structure 150 comprises an electrode 157 and between the electrode 157 and the first surface 101 a gate electrode 155, which is spatially separated and electrically isolated from the electrode 157.

A shielding region 140 formed in the semiconductor body 100 directly adjoins the electrode 157. The shielding region 140 forms a first pn junction pn1 with the drift structure 130. The shielding region 140 is formed along a lower edge of at least one section of the trench structure 150 and forms an ohmic contact with the electrode 157. The shielding region 140 can be formed completely within an imaginary vertical elongation (projection) of the trench structure 150 or project laterally beyond the outer edge of the trench structure 150 at least on one side. A vertical extent v0 of the shielding region 140 can be at least 500 nm.

On at least one side, a mesa section 170 of the semiconductor body 100 adjoins the trench structure 150. In a transistor region of the semiconductor device 500, a body region 120 can be formed in the mesa section 170, said body region laterally adjoining the trench structure 150. The body region 120 forms a second pn junction pn2 with the drift structure 130 and a third pn junction pn3 with a source region 110, which can be formed between the body region 120 and the first surface 101.

A gate dielectric 153 separates the gate electrode 155 from the body region 120. A field dielectric 159 separates the electrode 157 from the drift structure 130, wherein the gate dielectric 153 can merge into the field dielectric 159 along the sidewalls of the trench structure 150. A layer thickness th2 of the field dielectric 159 can be greater than a layer thickness th1 of the gate dielectric 155. A separating dielectric 156 separates the gate electrode 155 from the electrode 157 in the trench structure 150.

The gate electrode 155 is electrically connected or coupled to a gate terminal G. The source region 110, the body region 120 and the electrode 157 are connected in each case via low-impedance paths directly to a first load electrode 310 on the front side of the semiconductor body 100. The first load electrode 310 forms a first load terminal L1 or is electrically connected to the first load terminal L1. The base section 139 forms an ohmic resistance with a second load electrode 320, which can directly adjoin the second surface 102. The second load electrode 320 forms a second load terminal L2 or is electrically connected to the second load terminal L2.

Furthermore, a Schottky contact SC to the drift structure 130 is formed in the semiconductor device 500, wherein the Schottky contact SC is electrically connected in parallel with the transistor cells TC. An anode of the Schottky contact SC can be formed by a first contact structure 315 extending from the first load electrode 310 as far as the drift structure 130. The first load electrode 310 can be electrically connected with electrically low impedance to the source region 110 and the body region 120 via a second contact structure 316 and to the electrode 157 via a third contact structure 317.

The following description relates to semiconductor devices comprising n-channel transistor cells TC. The same is applicable, mutatis mutandis, to semiconductor devices comprising p-channel transistor cells. A sufficiently high voltage at the gate terminal G switches on the transistor cells TC. Along the gate dielectric 153, minority charge carriers accumulated as a result of a field effect form an inversion channel in the body region 120. The inversion channel forms a continuous path from the source region 110 to the drift structure 130 for electrons and enables a load current flow through the body region 120 and between the first and second load terminals L1, L2.

If the voltage at the gate terminal G again falls below a threshold voltage of the transistor cells TC, then the transistor cells TC turn off. The dopant concentration in the drift zone 131 and also the vertical extent of the drift zone 131 determine the dielectric strength of the semiconductor device 500. The potential of the shielding region 140 corresponds to the potential of the first load terminal L1, such that the shielding region 140 shields the gate dielectric 153 against the potential of the second load electrode L2. In addition, the shielding region 140 pins a voltage breakdown in the region of the first pn junction pn1.

In the reverse-biased state of the semiconductor device 500, the first pn junction pn1 is forward-biased, such that a reverse current can flow between the second load electrode 320 and the second contact structure 316 connected to the body region 120. The current across the first pn junction pn1 is a bipolar charge carrier flow composed of holes and electrons. An intensified recombination of holes and electrons occurs in the vicinity of pn junctions and in regions with a high doping concentration change. The energy liberated in the process fosters the growth of crystallographic defects that increasingly damage the SiC crystal. By way of example, dislocations between lattice planes, can transform into stacking faults (SFs) which, in silicon carbide of the 4H polytype, continue principally along the <0001> lattice planes and thus usually transversely with respect to the main current flow direction in the drift structure 130 and increasingly impede the current flow between the second load electrode 320 and the second contact structure 316.

Since the Schottky contact SC has a lower forward voltage than the first pn junction pn1, in the semiconductor device 500 in the reverse-biased state by far the majority of the current flows through the Schottky contact SC. No or only a marginal bipolar current flow occurs. Since the current flow through the switched-on transistor cells TC is unipolar and consists only of a single type of charge carriers, no appreciable recombination occurs in the drift structure 130, and no appreciable growth of stacking faults either.

It is true that in customary applications such as, for example, in bridge circuits or in the rectifier stages of low-voltage DC/DC converters for the reverse conducting state, the transistor channel is usually opened by a suitable gate voltage being applied, such that a current can flow via the first pn junction pn1 only for a comparatively short time. However, the transistor channel is switched on only after a certain minimum waiting time (dead time) in order to avoid in a bridge circuit, for example, the occurrence of a short circuit via low-side and high-side switches switched on simultaneously. In applications having long dead times or high switching frequencies, therefore, the short current flow via the first pn junction pn1 contributes significantly to the switchover losses. As a result of the lower threshold voltage of the Schottky contact SC and the low forward voltage thereof in relation to the threshold voltage of the bipolar diode formed by the first pn junction pn1, by far the majority of the reverse current flows via the Schottky contacts SC and produces fewer losses there. In addition, the current flow through the Schottky contact SC is a unipolar charge carrier flow which does not appreciably contribute to a bipolar degradation.

Figure 2A:
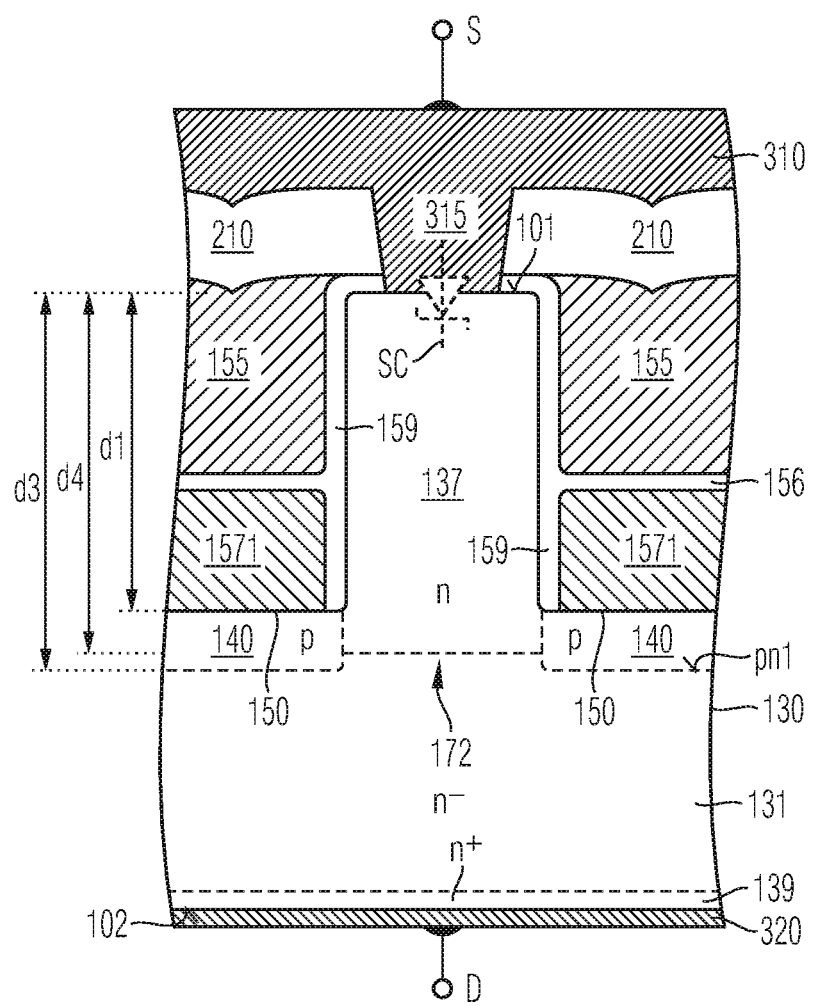
FIG. 2A is a schematic vertical cross section of a section of a semiconductor device in accordance with one embodiment comprising shallow Schottky contacts formed between adjacent sections of a trench structure.
Figure 2B:
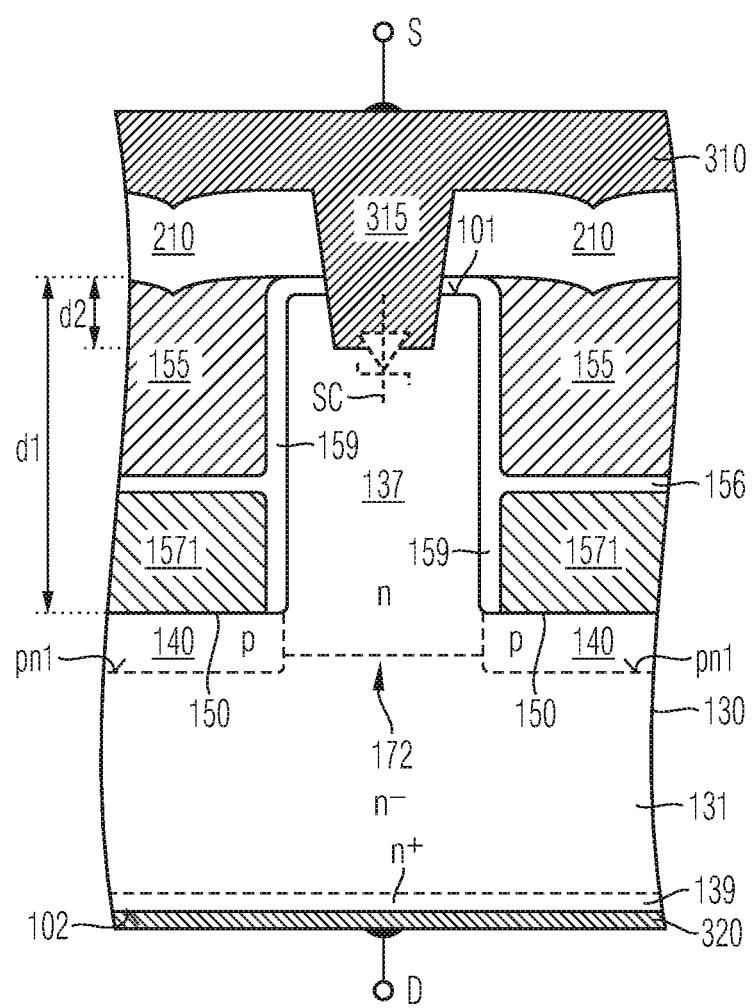
FIG. 2B is a schematic vertical cross section of a section of a semiconductor device in accordance with one embodiment comprising deep Schottky contacts formed between adjacent sections of a trench structure.

The semiconductor devices 500 illustrated in FIGS. 2A and 2B are n-channel MOSFETs, wherein in each case the first load electrode 310 is connected to or forms a source terminal S and the second load electrode 320 is connected to or forms a drain terminal D. Sections of the Schottky contact SC between first contact structures 315 and the drift structure 130 are formed in second mesa sections 172 of the semiconductor body 100 between adjacent sections of the trench structure 150. The first contact structures 315 extend from the first load electrode 310 through openings in an interlayer dielectric 210, which separates the first load electrode 310 from the gate electrode 155, at least as far as the first surface 101. The first contact structures 315 can comprise one or more partial layer(s), wherein a first partial layer directly adjoining the semiconductor body 100 comprises or consists of a material having a suitable work function.

In the second mesa sections 172, the drift structure 130 can comprise diode regions 137 having a dopant concentration that is set so as to result in a Schottky contact SC having suitable properties, for example having a barrier height in a range of from at least 0.8 eV to at most 2 eV. In addition, the diode regions 137 connect the Schottky contacts SC to the drift zone 131 with comparatively low impedance. By way of example, an average dopant concentration in the diode regions 137 is at least double, for example at least ten times, the magnitude of an average dopant concentration in the drift zone 131. A vertical extent d4 of the diode regions 137 can be dimensioned such that it is greater than or equal to a vertical extent d1 of the trench structure 150. The vertical extent d4 of the diode regions 137 can be less than a vertical distance d3 between the first surface 101 and a lower edge of the shielding regions 140.

The diode region 137 can be separated from the gate electrode 155 in the adjacent sections of the trench structure 150 by a section of the field dielectric 159.

FIG. 2A shows a planar first contact structure 315, which bears directly on the first surface 101.

FIG. 2B shows a first contact structure 315 that continues as a trench contact into the semiconductor body 100. A vertical extent d2 of a section of the first contact structure 315 in the semiconductor body 100 corresponds to a maximum distance between the Schottky contact SC and the first surface and can be less than the vertical extent d1 of the trench structure 150, for example at most 50% of d1, such that the shielding regions 140 shield the Schottky contact SC against the potential at the second load electrode 320 and the properties of the Schottky contact SC are largely independent of a potential difference between the source terminal S and the drain terminal D. The planar first contact structures 315 shown in FIG. 2A result for d2=0.

For the low-impedance connection of the electrode 157 to the first load electrode 310, the trench structure 150 can comprise, besides first sections 151 in which the gate electrode 155 is formed between the first surface 101 and main sections 1571 of the electrode 157, second sections 152 in which the second contact structures 316 directly adjoin the electrode 157. Connection regions 1572 of the electrode 157 are formed in the second sections 152, which connection regions connect the main sections 1571 and can extend as far as the first surface 101. The gate electrode 155 can be completely absent in the second sections 152.

Figure 3A:
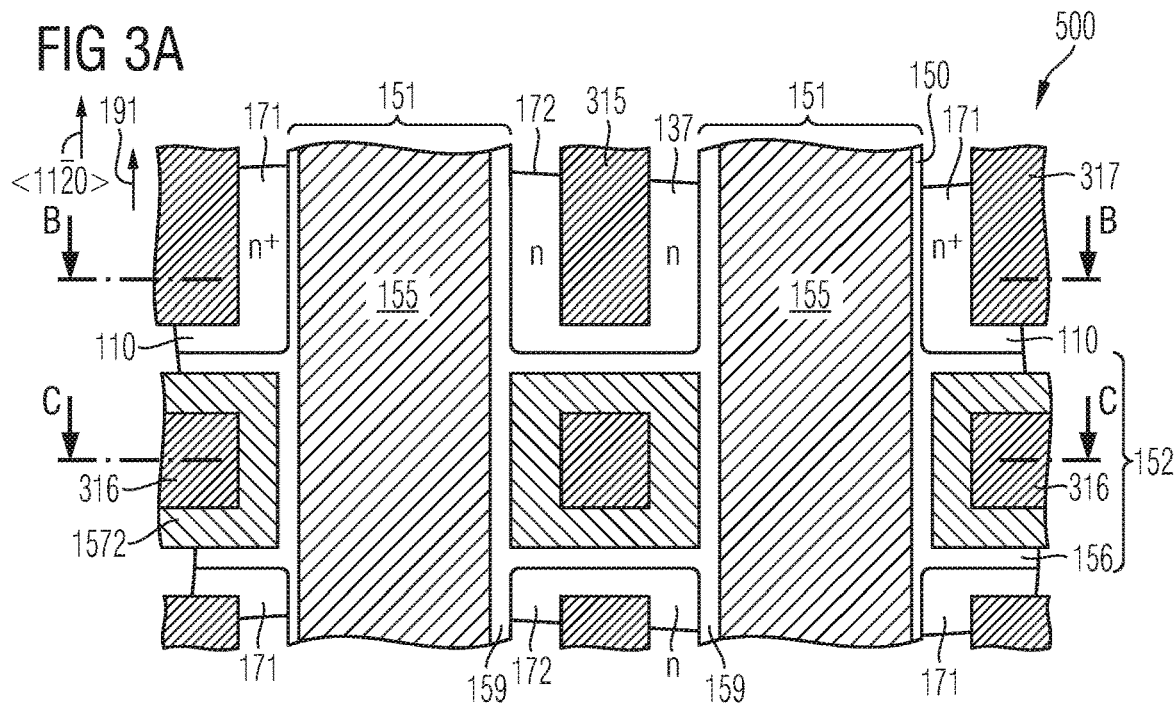
FIG. 3A is a schematic horizontal cross section of a section of a semiconductor device in accordance with one embodiment comprising Schottky contacts formed between adjacent sections of a trench structure having vertical sidewalls.
Figure 3B:
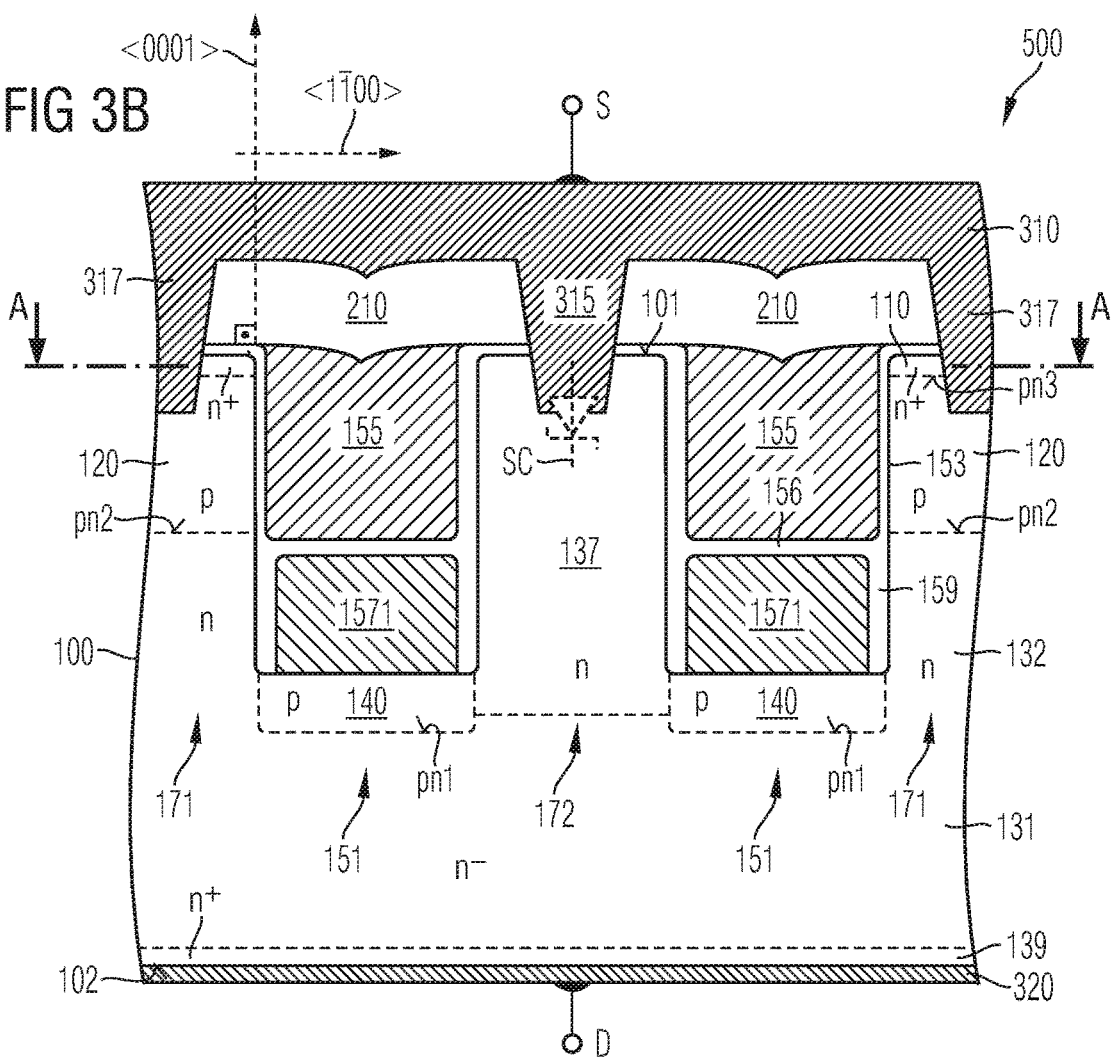
FIG. 3B is a schematic vertical cross section through the semiconductor device section from FIG. 3A along the line B-B.
Figure 3C:
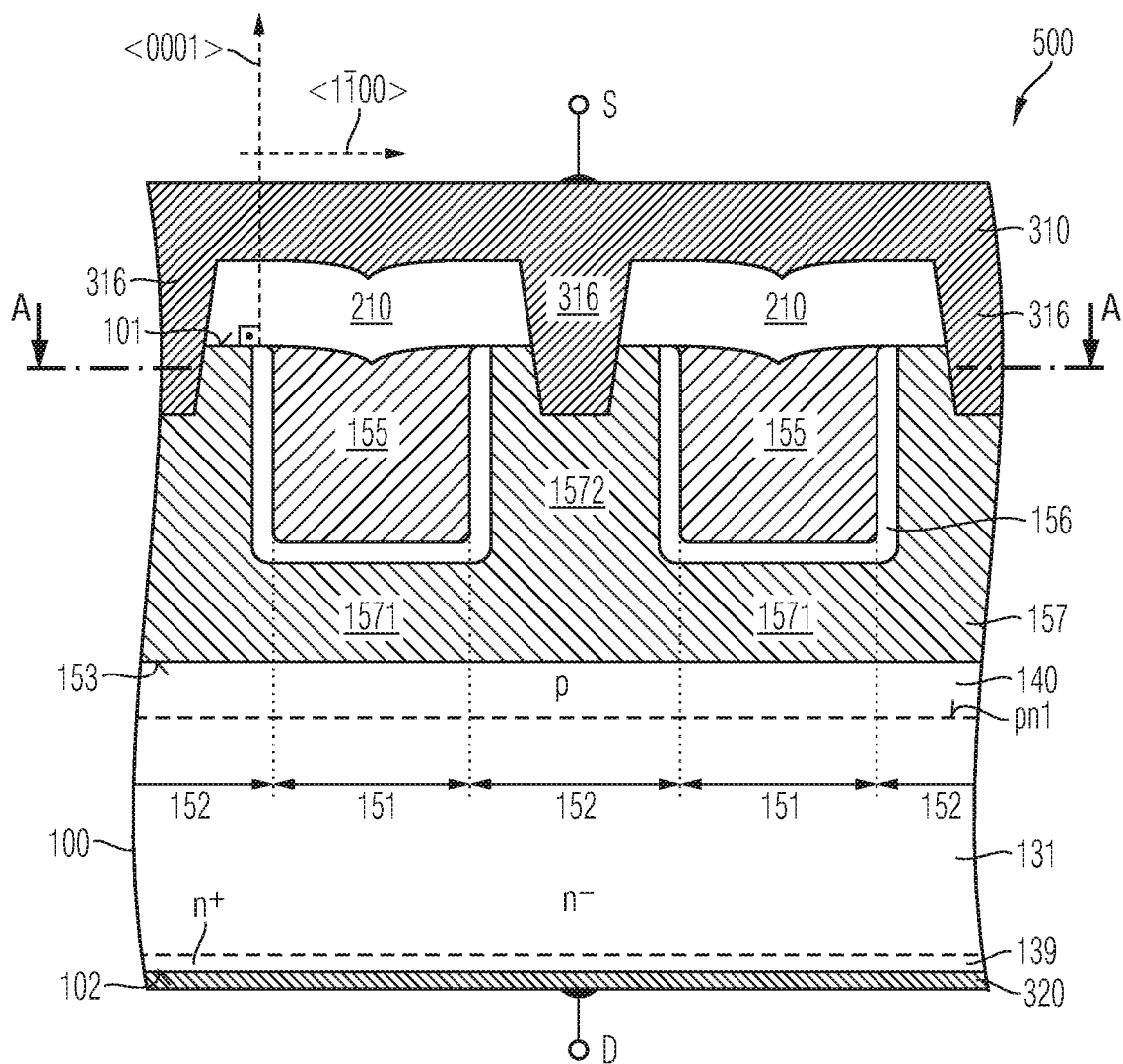
FIG. 3C is a schematic vertical cross section through the semiconductor device section from FIG. 3A along the line C-C.
Figure 4A:
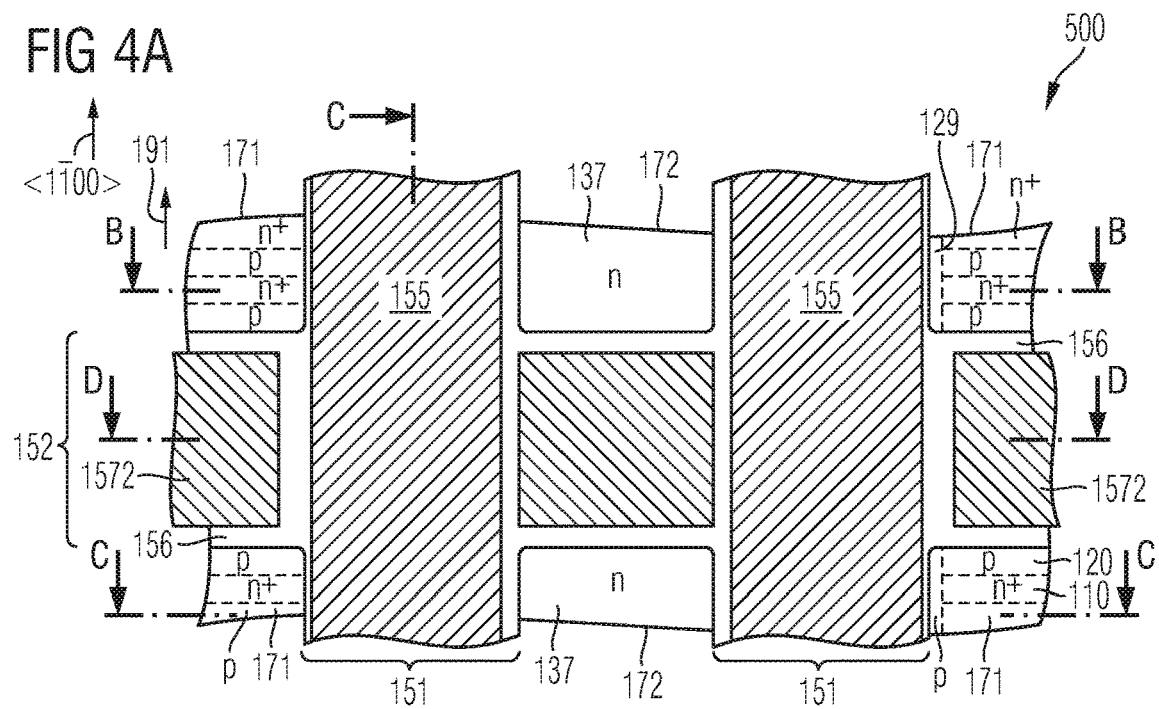
FIG. 4A is a schematic horizontal cross section of a section of a semiconductor device in accordance with one embodiment comprising Schottky contacts formed between sections of a trench structure having slightly tilted sidewalls.
Figure 4B:
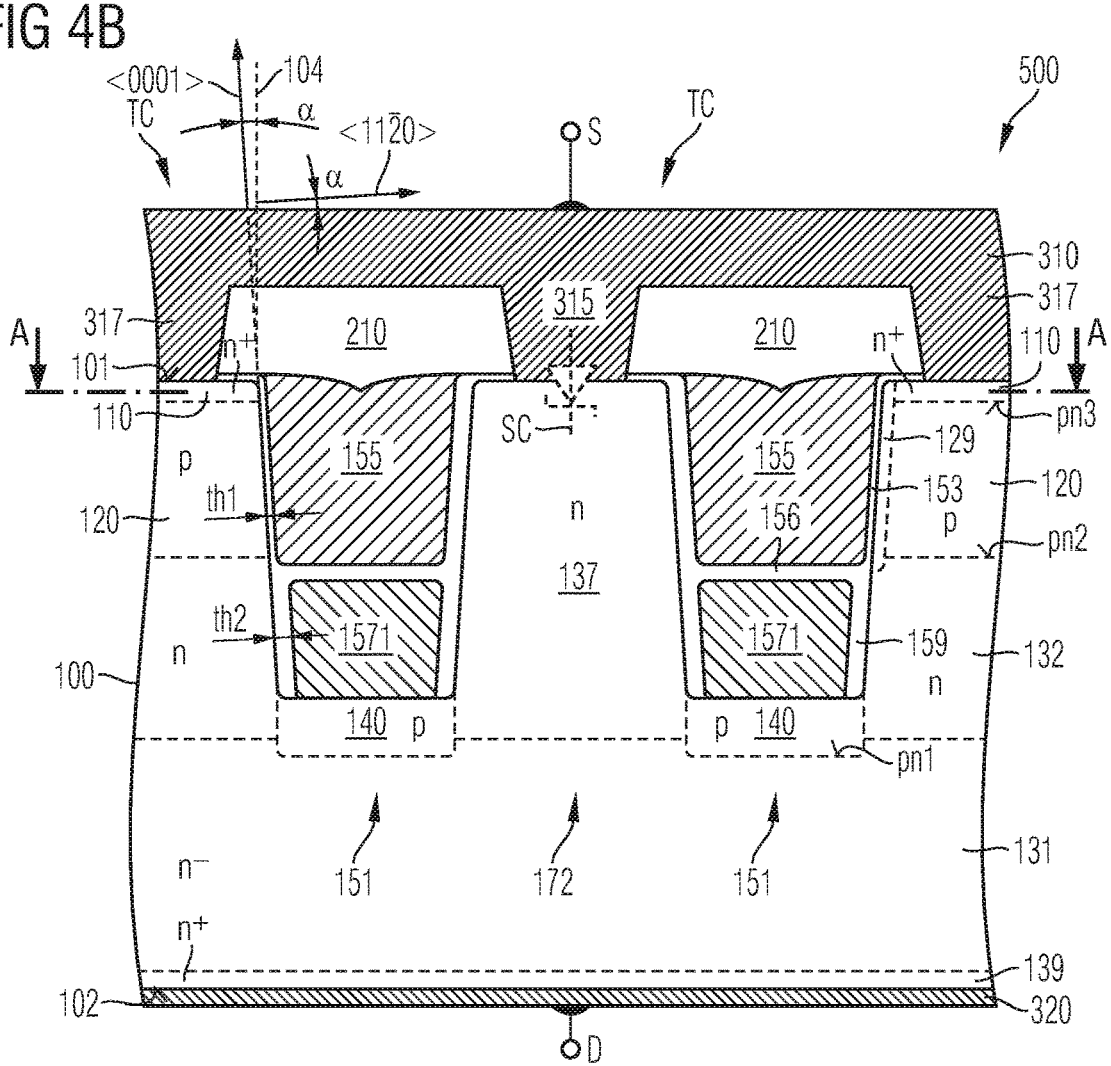
FIG. 4B is a schematic vertical cross section through the semiconductor device section from FIG. 4A along the line B-B.
Figure 4D:
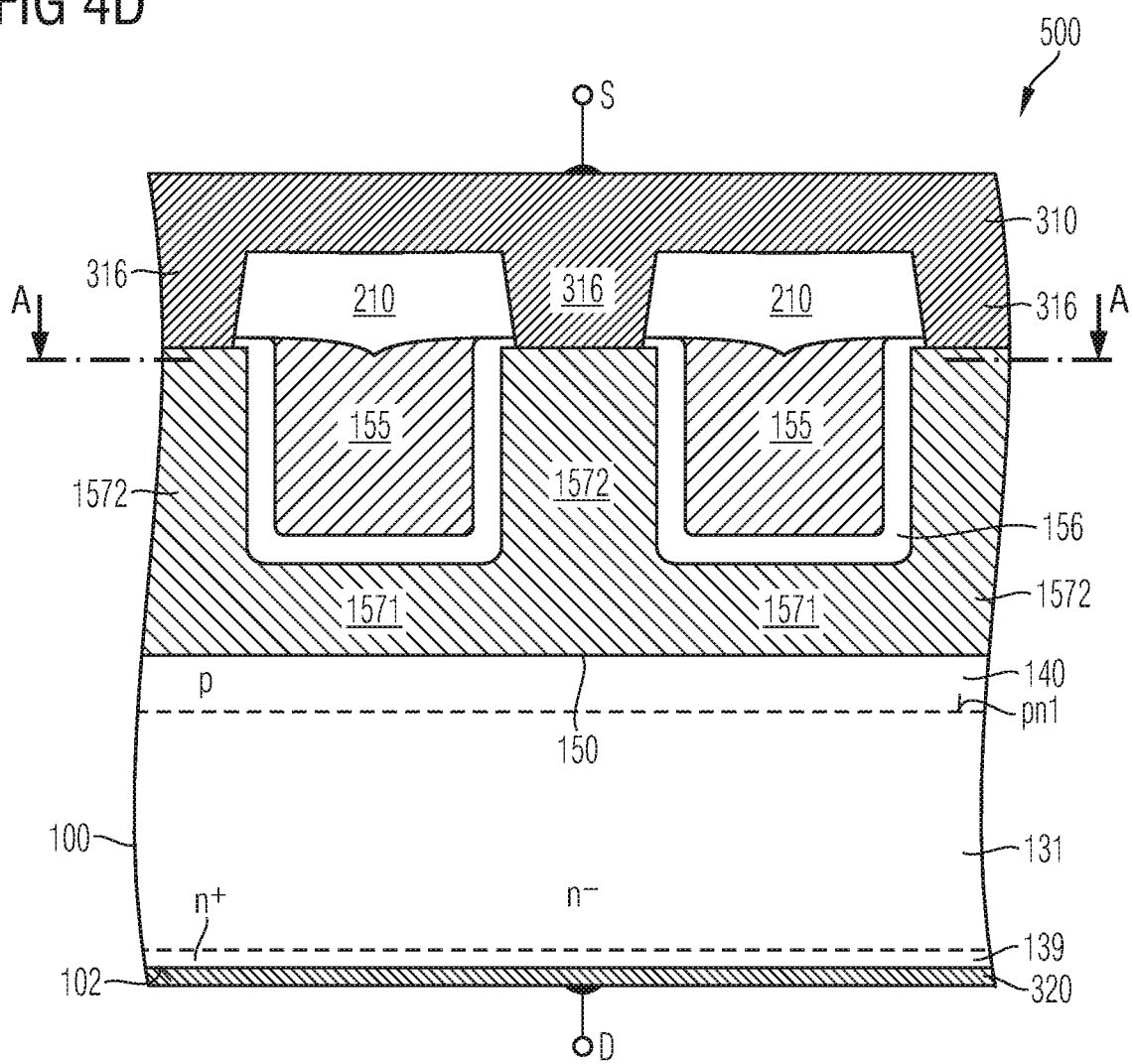
FIG. 4D is a schematic vertical cross section through the semiconductor device section from FIG. 4A along the line D-D.

FIGS. 3A to 3C show a semiconductor device 500 in which the first sections 151 of the trench structure 150 comprise strips having a longitudinal extent along a lateral first direction 191. The second sections 152 are in each case laterally adjacent to the first sections 151 and connect adjacent first sections 151 to one another, without interrupting the first sections 151 along the first direction 191.

The first sections 151 can be arranged with a regular center-to-center distance. The first sections 151 and the second sections 152 of the trench structure 150 form a lattice that laterally encloses first mesa sections 171 and second mesa sections 172 of the semiconductor body.

The first mesa sections 171 form transistor regions having body regions 120 and having source regions 110 of the transistor cells TC. The second mesa sections 172 form Schottky regions having sections of the Schottky contact SC. The first contact structures 315 can comprise one, two or more partial layers and extend as trench contacts into the drift structure 130. The second contact structures 316 can extend into the connection region 1572 of the electrode 157. The second contact structures 316 can each comprise one, two or more partial layers, wherein the partial layer directly adjoining the electrode 157 can be formed from the same material as a first partial layer of the first contact structure 315 or from a different material than the first partial layer of the first contact structure 315.

Third contact structures 317, which can extend from the first load electrode 310 through openings in the interlayer dielectric 210 as far as the semiconductor body 100 or as trench contacts into the semiconductor body 100, can likewise comprise one, two or more partial layers, wherein the first partial layer directly adjoining the semiconductor body 100 can consist of the same material as the first partial layer of the first contact structure 315 or of a different material than the first partial layer of the first contact structure 315.

The third contact structures 317 can extend through the source regions 110 right into the body regions 120. First contact structures 315 and second contact structures 316 arranged along the first direction 191 can be formed in each case at a distance from one another. Third contact structures 317 and second contact structures 316 formed along the first direction 191 can likewise be at a distance from one another.

The exemplary embodiment depicted relates to an SiC semiconductor body 100 in which the <0001> lattice direction is inclined relative to the cross-sectional plane in FIGS. 3B and 3C by an angle deviation α of between 2° and 8°. The <1-100> lattice direction runs orthogonally to the first direction 191 and parallel to the first surface 101. In a plane perpendicular to the cross-sectional plane in FIG. 3A and parallel to the first direction 191, the <11-20> lattice direction has the angle deviation α relative to the first direction 191.

In FIGS. 4A to 4D, the <0001> lattice direction is tilted relative to the normal 104 to the first surface 101 by an angle deviation α. The first direction 191 is parallel to the <1-100> lattice direction.

Transistor cells TC are formed in each case only on one side of the trench structure 150. The first, second and third contact structures 315, 316, 317 can be formed in each case as planar contacts, wherein the first contact structures 315 and the third contact structures 317 bear directly on the first surface 101 and the second contact structures 316 can have approximately the same vertical extent as the first and third contact structures 315, 317. In the first mesa sections 171, the body regions 120 extend in sections as far as the first surface 101. By way of example, at the first surface 101 source regions 110 and exposed sections of the body regions 120 alternate along the first direction 191.

In the first mesa sections 171, the drift structure 130 can have current distribution regions 132, which are formed between the body regions 120 and the drift zone 131 and which can directly adjoin the body regions 120 and the drift zone 131. A dopant concentration in the current distribution regions 132 can be at least double, for example at least ten times, the dopant concentration in the drift zone 131. The dopant concentration in the current distribution regions 132 can be equal or approximately equal to the dopant concentration in the diode regions 137. By way of example, the current distribution regions 132 and the diode regions 137 may have emerged from the same epitaxial layer.

In the exemplary embodiment shown, only the right sidewalls of the first mesa sections 171 lie in a principal lattice plane of a first type, while the left sidewalls are inclined relative to the principal lattice plane of the first type by double the angle deviation α. P-doped channel inhibition regions 129 along the left mesa sidewalls of the first mesa sections 171 can be designed such that the formation of a transistor channel along the left mesa sidewalls is suppressed during operation of the semiconductor devices 500 within the absolute maximum ratings.

Figure 5A:
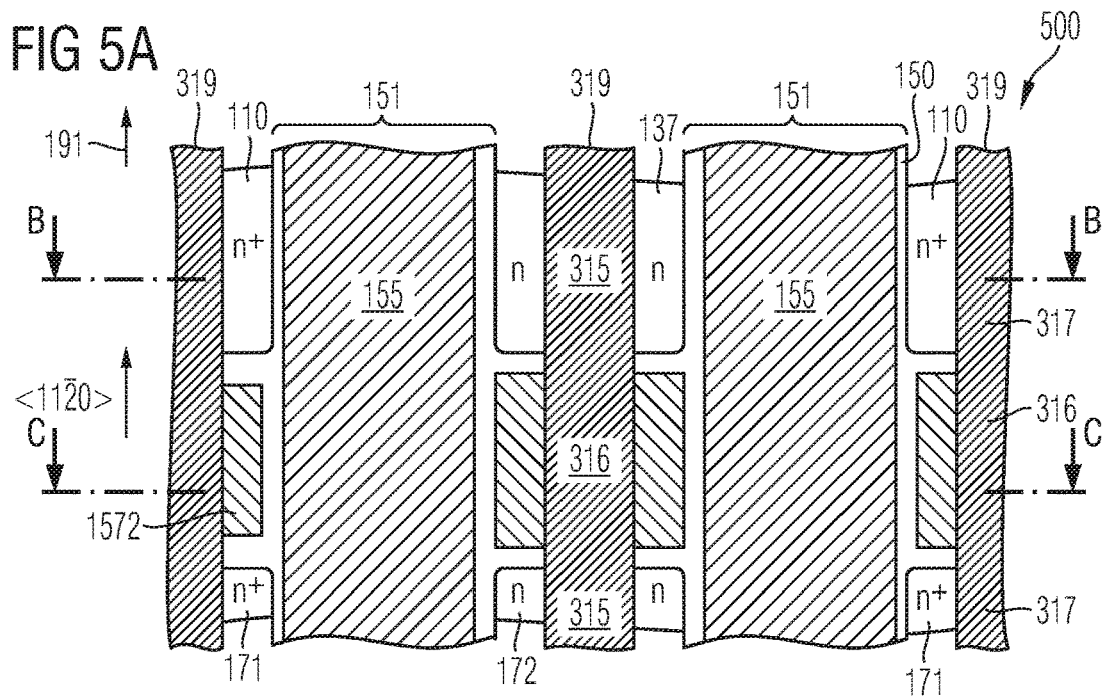
FIG. 5A is a schematic horizontal cross section through a section of a semiconductor device in accordance with one embodiment comprising continuous contact strips.
Figure 5B:
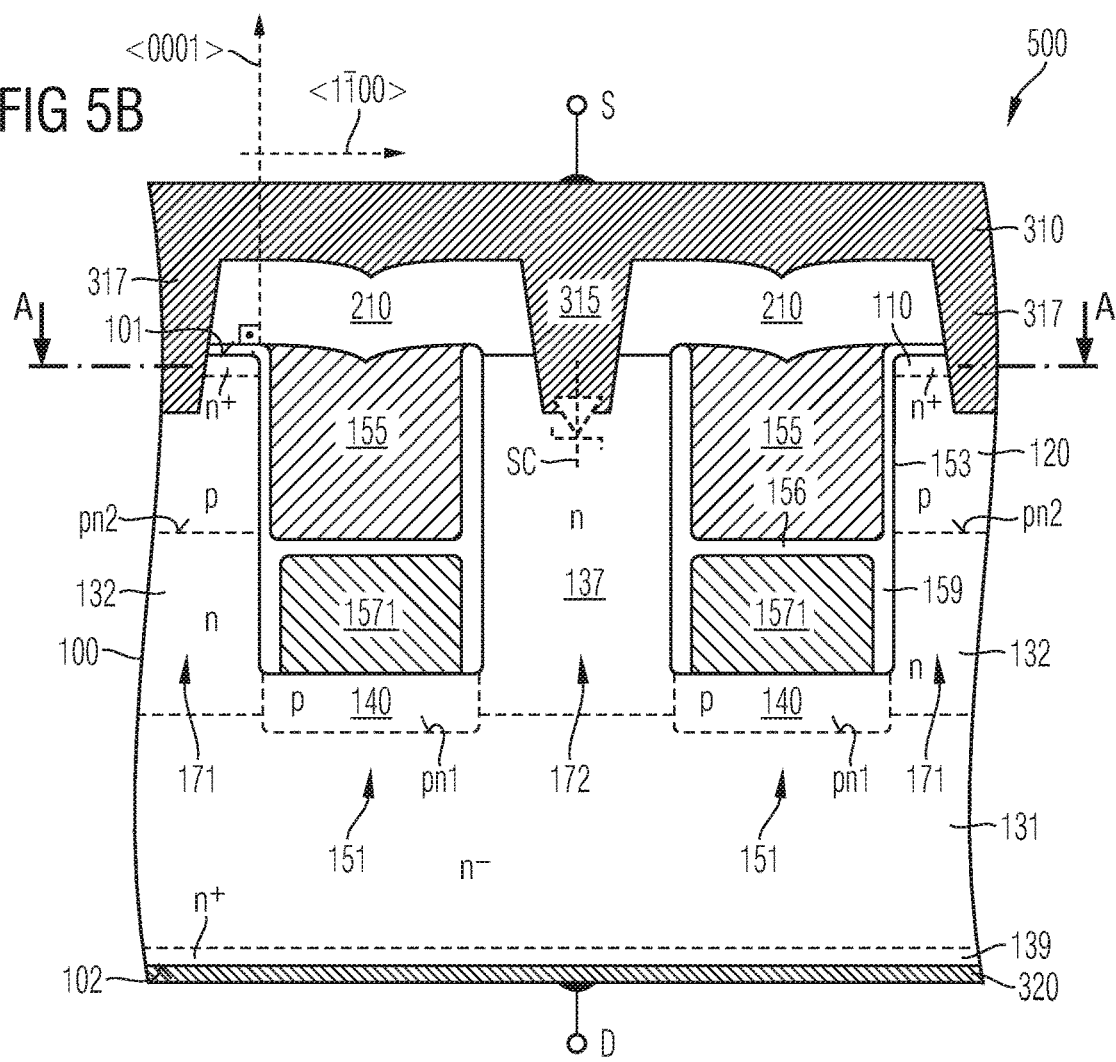
FIG. 5B is a schematic vertical cross section through the semiconductor device section from FIG. 5A along the line B-B.
Figure 5C:
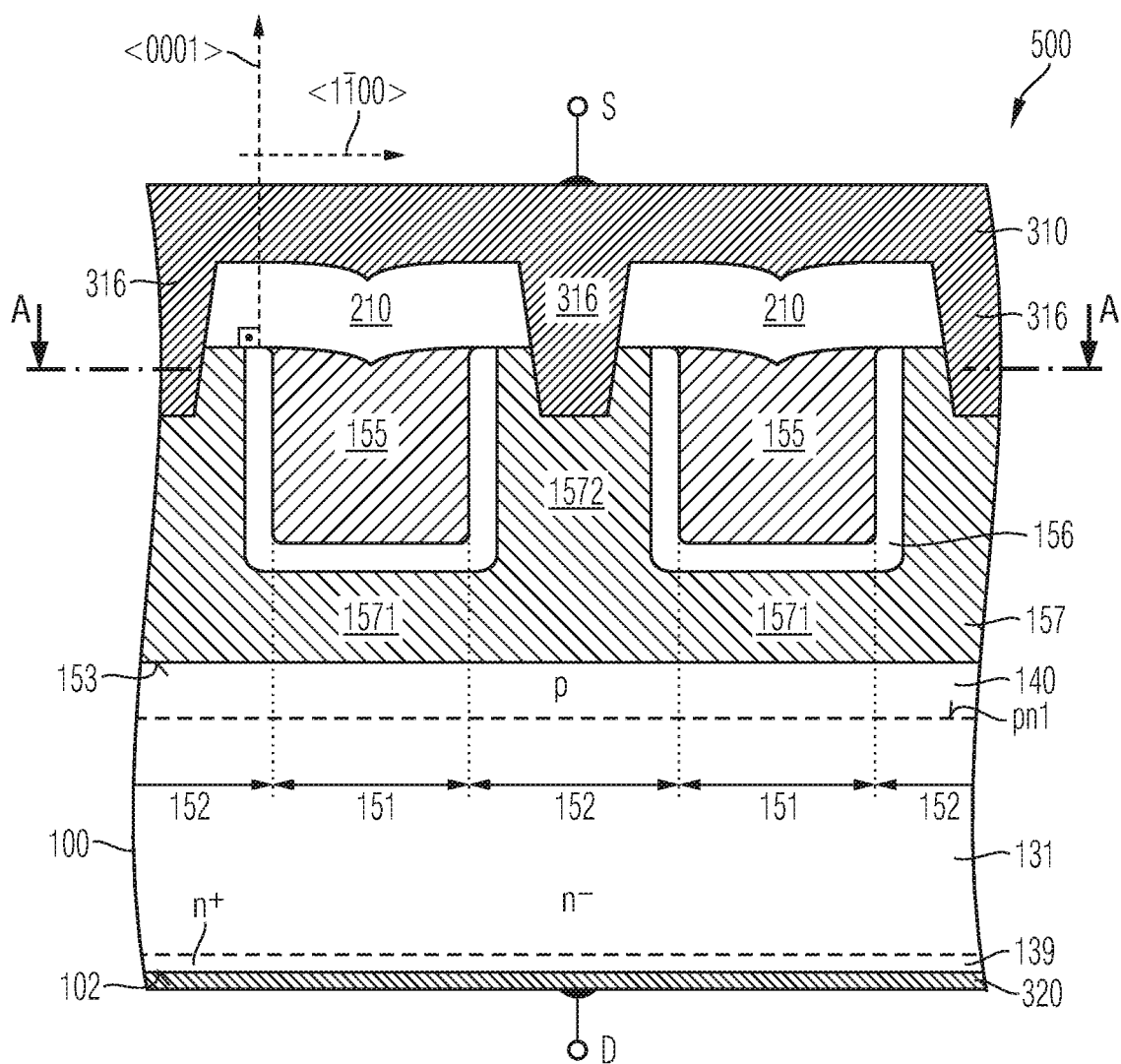
FIG. 5C is a schematic vertical cross section through the semiconductor device section from FIG. 5A along the line C-C.

FIGS. 5A to 5C show a semiconductor device 500 in which continuous contact strips 319 are formed, which can form alternately first and second contact structures 315, 316 and/or alternately first and second contact structures 315, 316. The contact strips 319 can contact the first and second mesa sections 171, 172 in a planar fashion or be formed as trench contacts, as illustrated in FIGS. 5A to 5C.

Figure 6A:
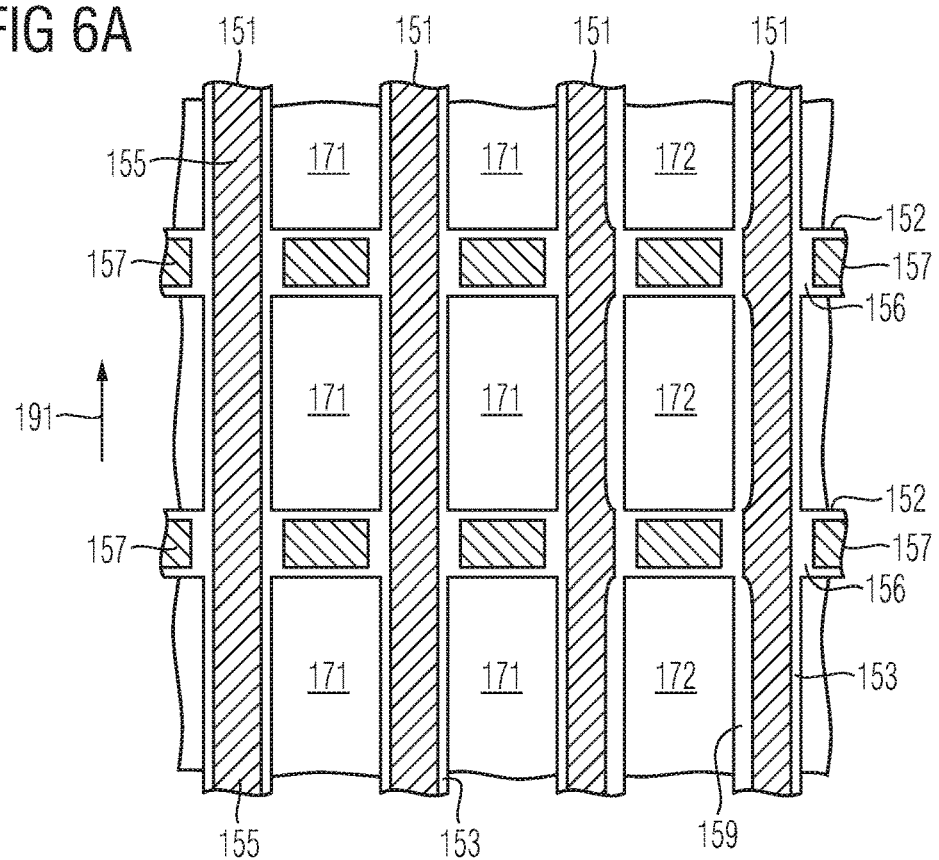
FIG. 6A is a schematic horizontal cross section through a semiconductor device in accordance with one embodiment comprising Schottky regions arranged in rows.

FIG. 6A shows first mesa sections 171 and second mesa sections 172 arranged in each case in rows extending along the first direction 191. A total area ratio of first mesa sections 171 to second mesa sections 172 can lie in a range of from 10% to 50%, for example in a range of from 15% to 30%. By way of example, two to ten rows having first mesa sections 171 can be formed between two adjacent rows having second mesa sections 172.

Figure 6B:
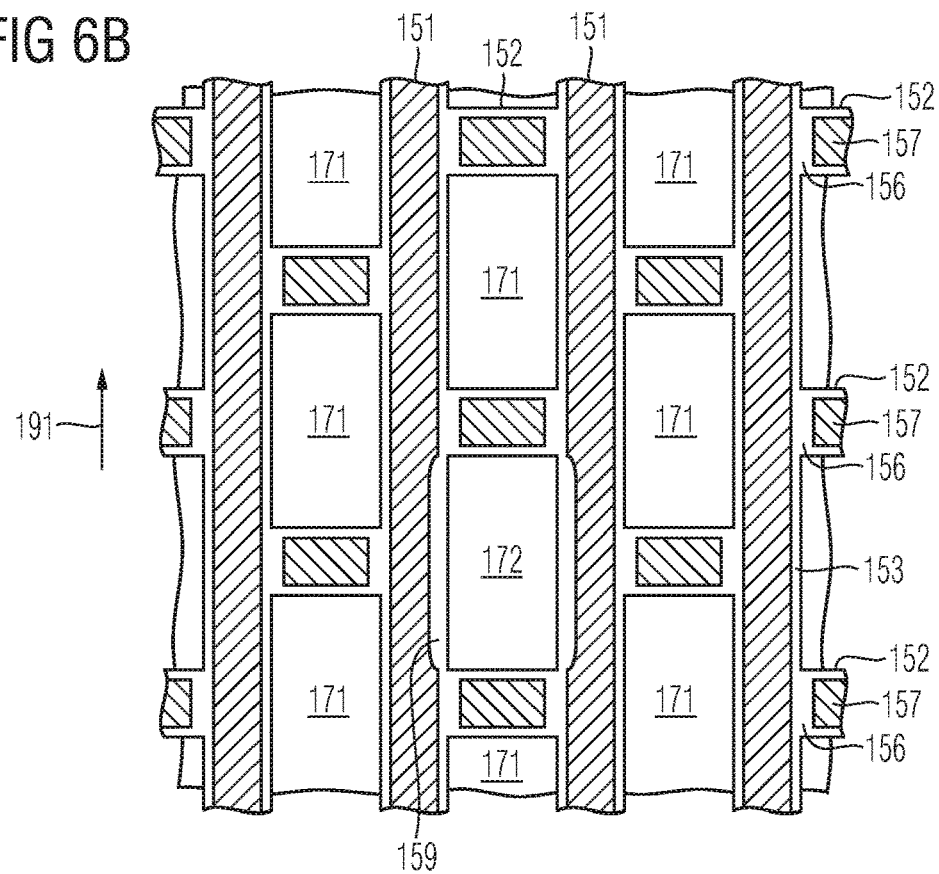
FIG. 6B is a schematic horizontal cross section through a semiconductor device in accordance with one embodiment comprising Schottky regions arranged in rows and separated from one another by transistor regions within the rows.

In FIG. 6B, the first and second mesa sections 171, 172 are arranged in rows which extend along the first direction 191 and are offset relative to one another, wherein an offset between two adjacent rows can correspond in each case to half a center-to-center distance between two adjacent second sections 152 of the trench structure 150 of the same row. The trench structure 150 forms a lattice. The second mesa sections 172 having the sections of the Schottky contact SC can be formed in each case only in a proper subset of the rows, wherein within the same row one, two or more first mesa sections 171 can be formed between adjacent second mesa sections 172. A longitudinal extent of the first mesa sections 171 along the first direction 191 can be equal to the longitudinal extent of the second mesa sections 172 along the first direction 191.

Figure 6C:
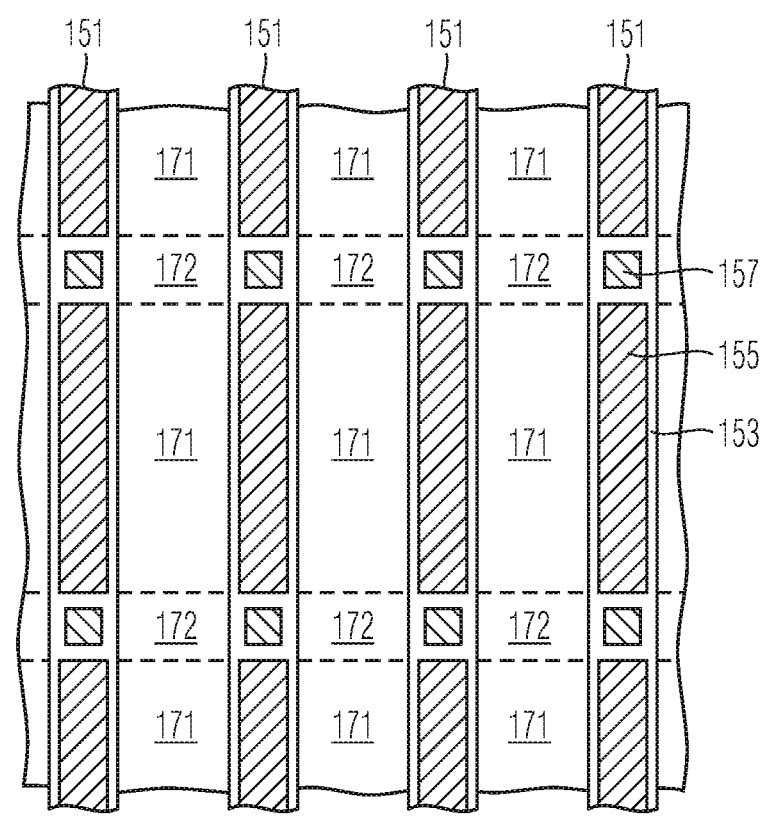
FIG. 6C is a schematic horizontal cross section through a semiconductor device in accordance with one embodiment comprising Schottky regions formed in inactive regions between adjacent sections of a trench structure.

FIG. 6C relates to an embodiment in which the second sections 152 of the trench structure 150 separate first sections 151 of the trench structure 150 from one another along the first direction 191. In the second sections 152, connection sections 1572 of the electrode 157 replace the gate electrode 155, such that no transistor cells can be formed in regions of the semiconductor body 100 which adjoin the connection sections 1572. Instead, the second mesa sections 172, in which sections of the Schottky contact SC are formed, can be provided in the regions adjoining the connection sections 1572. Along the first direction 191, first mesa sections 171, in which transistor cells TC are formed, can alternate directly with second mesa sections 172, in which sections of the Schottky contact are formed.

Figure 7:
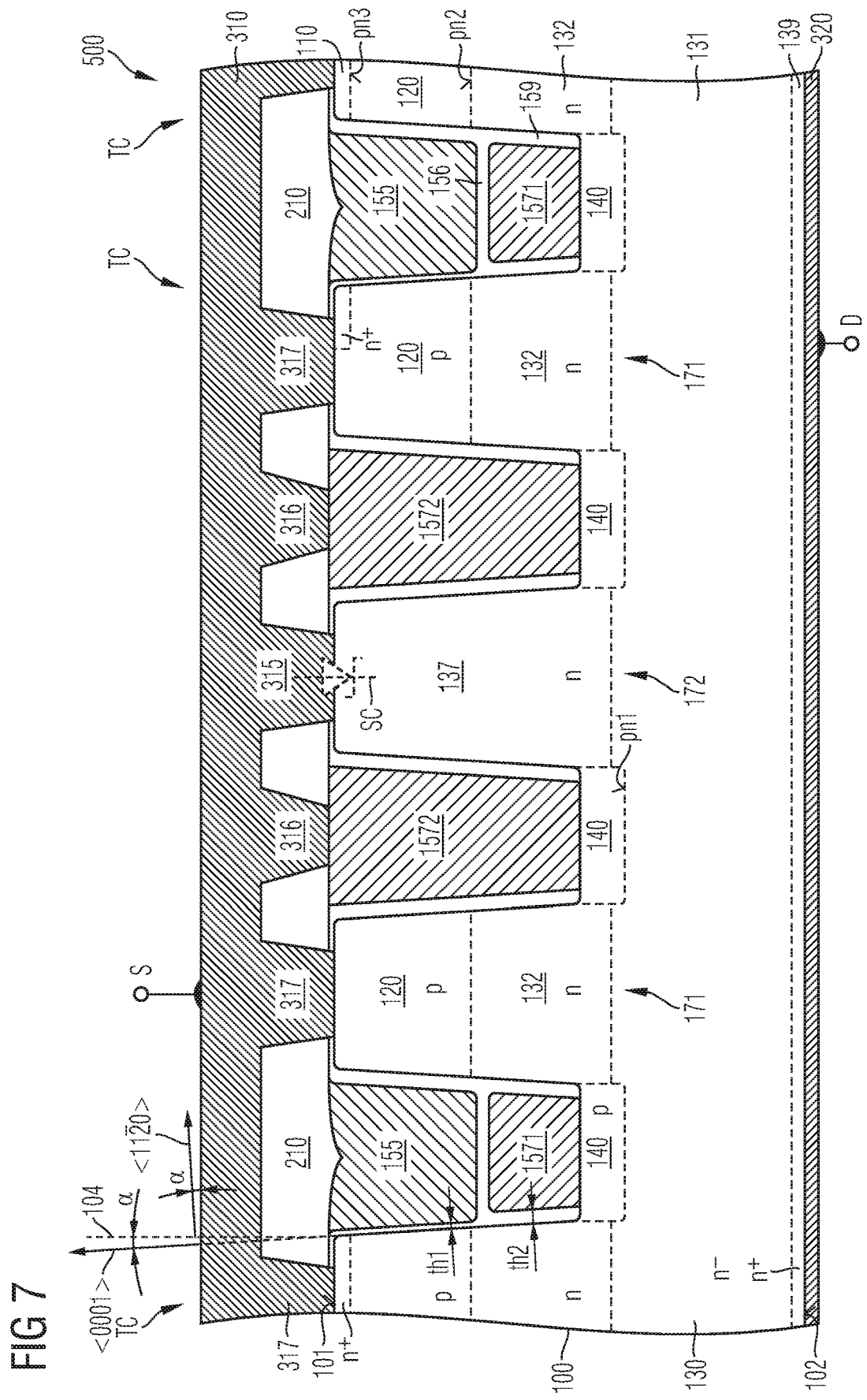
FIG. 7 is a schematic vertical cross section through a section of a semiconductor device in accordance with a further embodiment comprising Schottky contacts formed in inactive regions.

FIG. 7 shows a semiconductor device 500 in which the sections of the Schottky contact SC are formed between adjacent second sections 152 of the trench structure 150. The first, second and third contact structures 315, 316, 317 can be planar contact structures or contact structures which extend into the semiconductor body 100.

Sections of the field dielectric 159 along the left sidewalls of the first mesa sections 171 can be designed such that the formation of a transistor channel along the left sidewalls of the first mesa sections 171 is suppressed during operation of the semiconductor device 500 within the absolute maximum ratings.

FIGS. 8A to 10B relate to semiconductor devices 500 comprising semiconductor bodies 100, drift structures 130, shielding regions 140, second contact structures 316, third contact structures 317 and trench structures 150 as described above with reference to FIGS. 1 to 7C, wherein the trench structure 150 in each case comprises first sections 151 having a longitudinal extent along a lateral first direction 191 and second sections 152 which in each case are laterally adjacent to the first sections 151 and connect adjacent first sections 151 to one another, without interrupting the first sections 151 along the first direction 191.

The first sections 151 can be arranged at a regular center-to-center distance. The first sections 151 and the second sections 152 of the trench structure 150 form a lattice that laterally encloses mesa sections 170 of the semiconductor body 100.

Body regions 120 are formed in the mesa sections 170, said body regions laterally adjoining the trench structure 150. The body regions 120 form second pn junctions pn2 with the drift structure 130 and third pn junctions pn3 with source regions 110, which can be formed between the body regions 120 and the first surface 101.

An electrode 157 and between the electrode 157 and the first surface 101 a gate electrode 155 are formed in the first sections 151 of the trench structure 150. In the second sections 152, the gate electrode 155 can be completely absent and, instead, a connection region 1572 of the electrode 157 can extend as far as or to just beneath the first surface 101. In the region of the second sections 151 of the trench structure 150, the second contact structures 316 directly adjoin the connection regions 1572 of the electrode 157, such that the shielding regions 140 over the entire horizontal cross-sectional area of the semiconductor body 100 are in each case connected to the first load electrode 310 locally with low impedance and at the same time in the first sections 151 of the trench structure 150 the gate electrode 155 is not interrupted but rather is formed continuously in the longitudinal direction of the first sections 151.

The electrode 157 thus forms a section of a direct, low-impedance connection between the shielding region 140 and the first load electrode 310. The electrode 157 is composed of a material in which the charge carrier mobility is significantly higher than in heavily doped monocrystalline silicon carbide. By way of example, the electrode 157 comprises a metal-containing layer and/or heavily doped polycrystalline silicon or consists of one or more metal-containing layers and/or heavily doped polycrystalline silicon.

In the case of an avalanche breakdown, the electrode 157 carries away the avalanche current via a low-impedance path directly to the first load electrode 310, without there being established in the process a vertical charge carrier flow through the mesa sections 170, where the charge carriers can act as a base current of a parasitic npn bipolar transistor formed by the source region 110, the body region 120 and the drift zone 131. In this way, the electrode 157 in conjunction with the shielding region 140 improves the breakdown strength and the avalanche strength of the semiconductor device 500.

Compared with approaches that connect shielding regions to the first load terminal via a doped region in the mesa section 170, more semiconductor material can be assigned to the actual transistor functionality. The distance between adjacent trench structures 150 can be chosen to be smaller and a dopant concentration in sections of the drift structure 130 which directly adjoin the body regions 120 can be increased further in order to reduce the connection resistance between the transistor channels and the drift structure 130.

The second and third contact structures 316, 317 can in each case be formed in a manner spatially separated from one another or form sections of continuous contact strips 319.

Figure 8A:
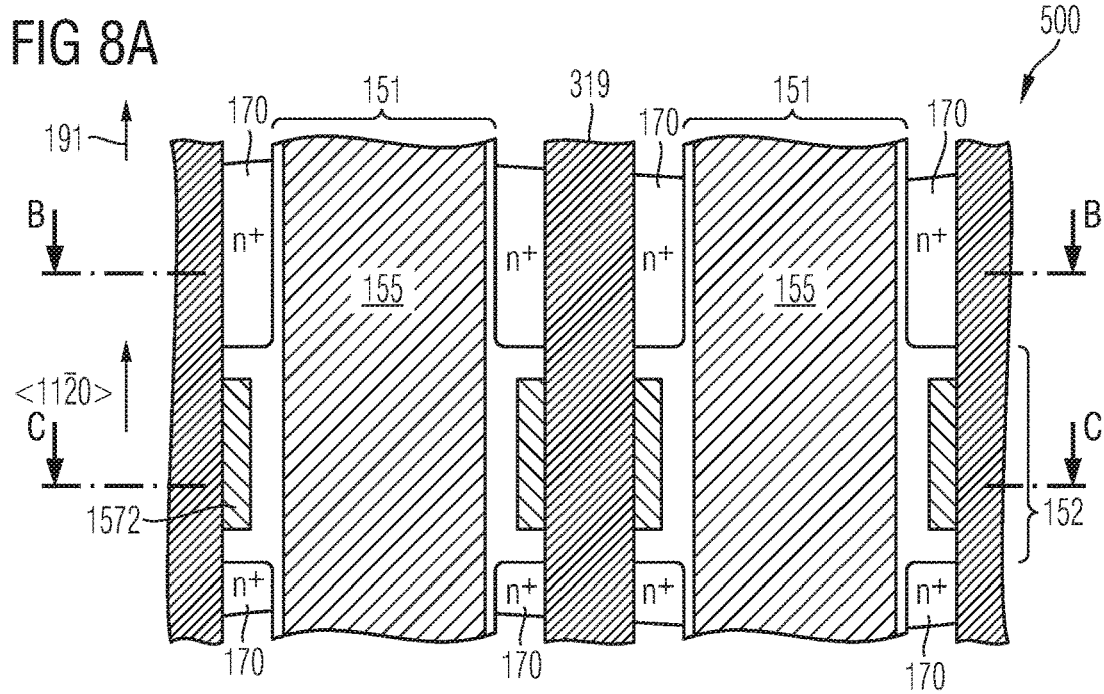
FIG. 8A is a schematic horizontal cross section through a section of a semiconductor device comprising connection regions for an electrode connected to a shielding region, which are arranged alongside sections of the trench structure with the gate electrode, in accordance with one embodiment.
Figure 8B:
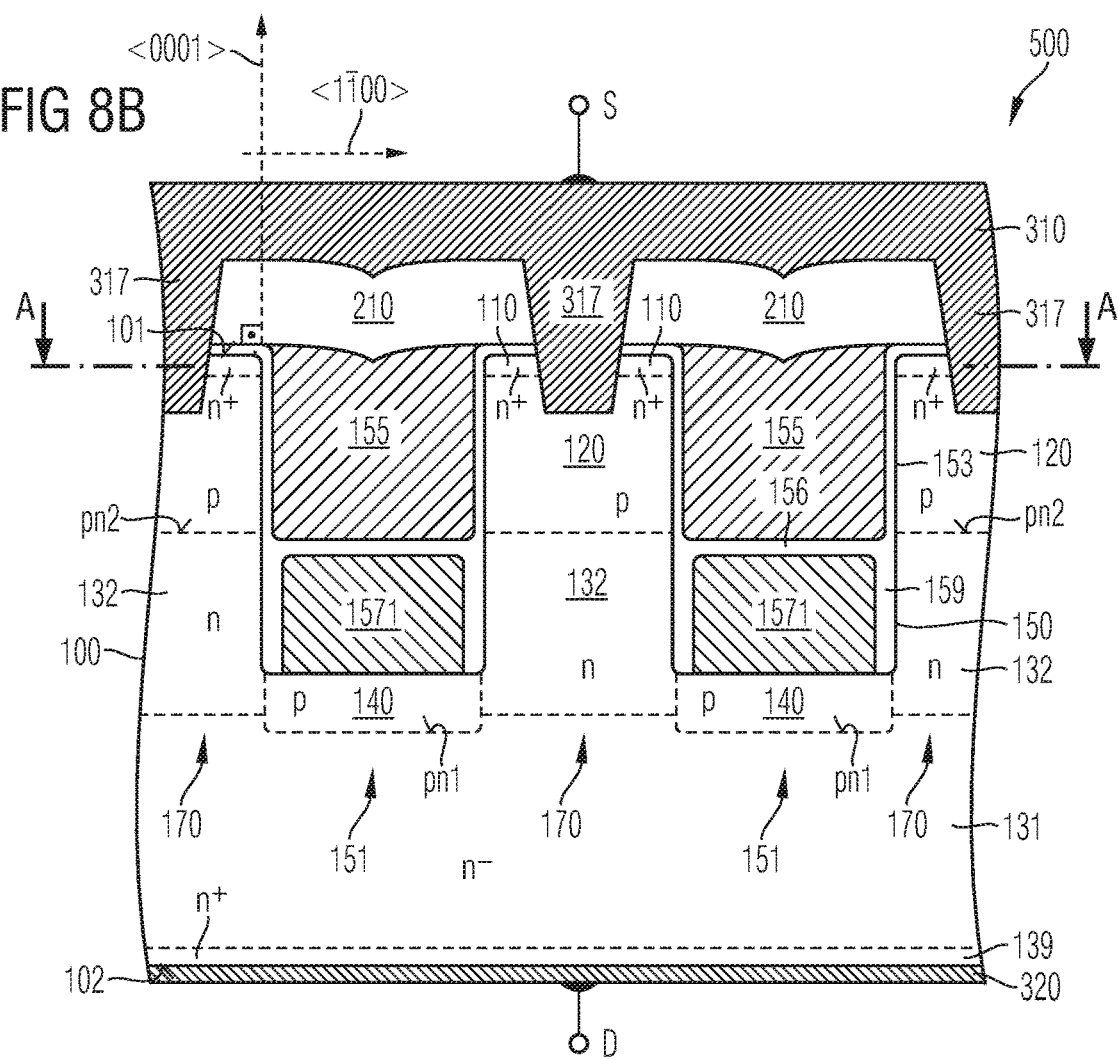
FIG. 8B is a schematic vertical cross section through the semiconductor device section from FIG. 8A along the line B-B.
Figure 8C:
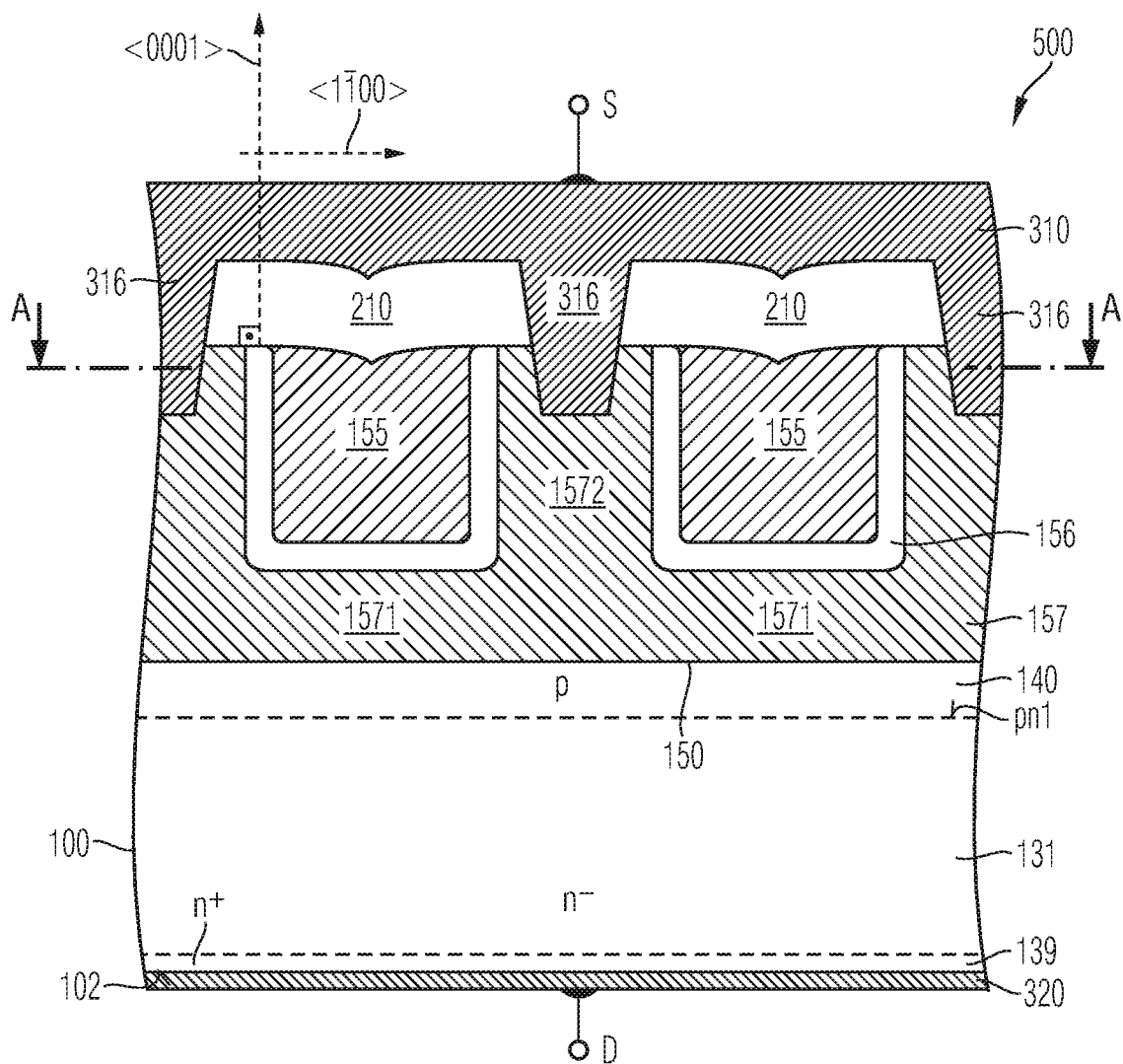
FIG. 8C is a schematic vertical cross section through the semiconductor device section from FIG. 8A along the line C-C.

The exemplary embodiment depicted relates to an SiC semiconductor body 100 in which the <0001> lattice direction is inclined relative to the cross-sectional plane in FIGS. 8B and 8C by an angle deviation α of between 2° and 8°. The <1-100> lattice direction runs orthogonally to the first direction 191 and parallel to the first surface 101. In a plane perpendicular to the cross-sectional plane in FIG. 8A and parallel to the first direction 191, the <11-20> lattice direction has the angle deviation α relative to the first direction 191.

Figure 9A:
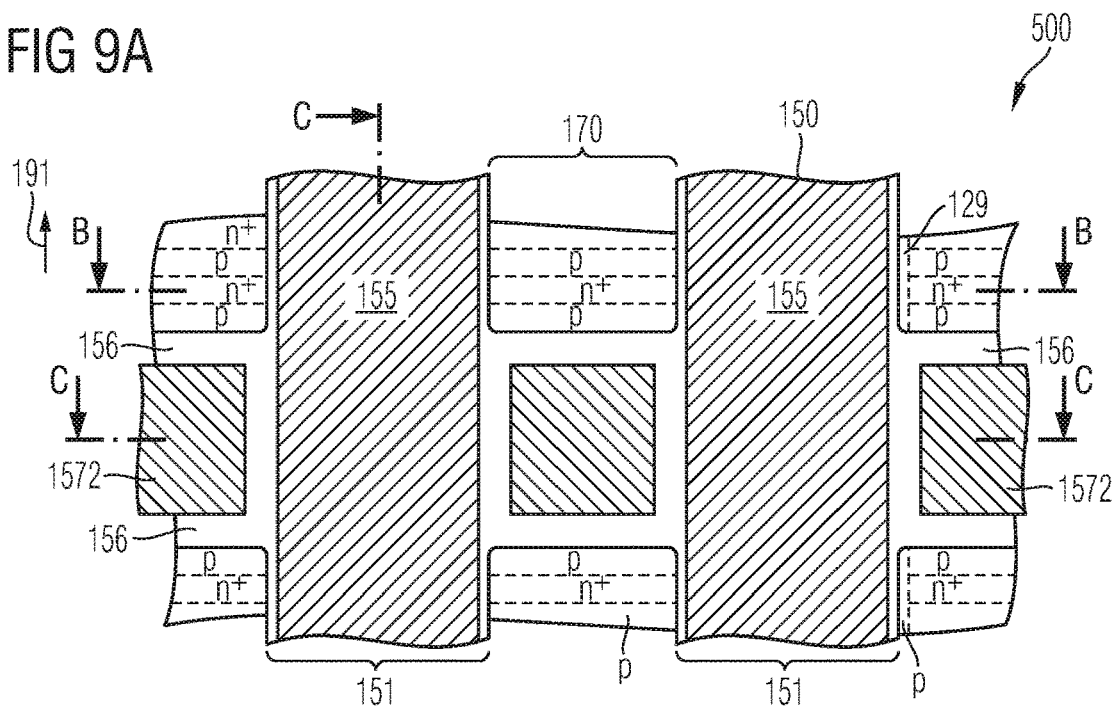
FIG. 9A is a schematic horizontal cross section through a section of a semiconductor device comprising connection regions for an electrode connected to the trench structure, said connection regions being arranged between adjacent sections of a trench structure with a gate electrode, in accordance with one embodiment comprising shallow contacts.
Figure 9B:
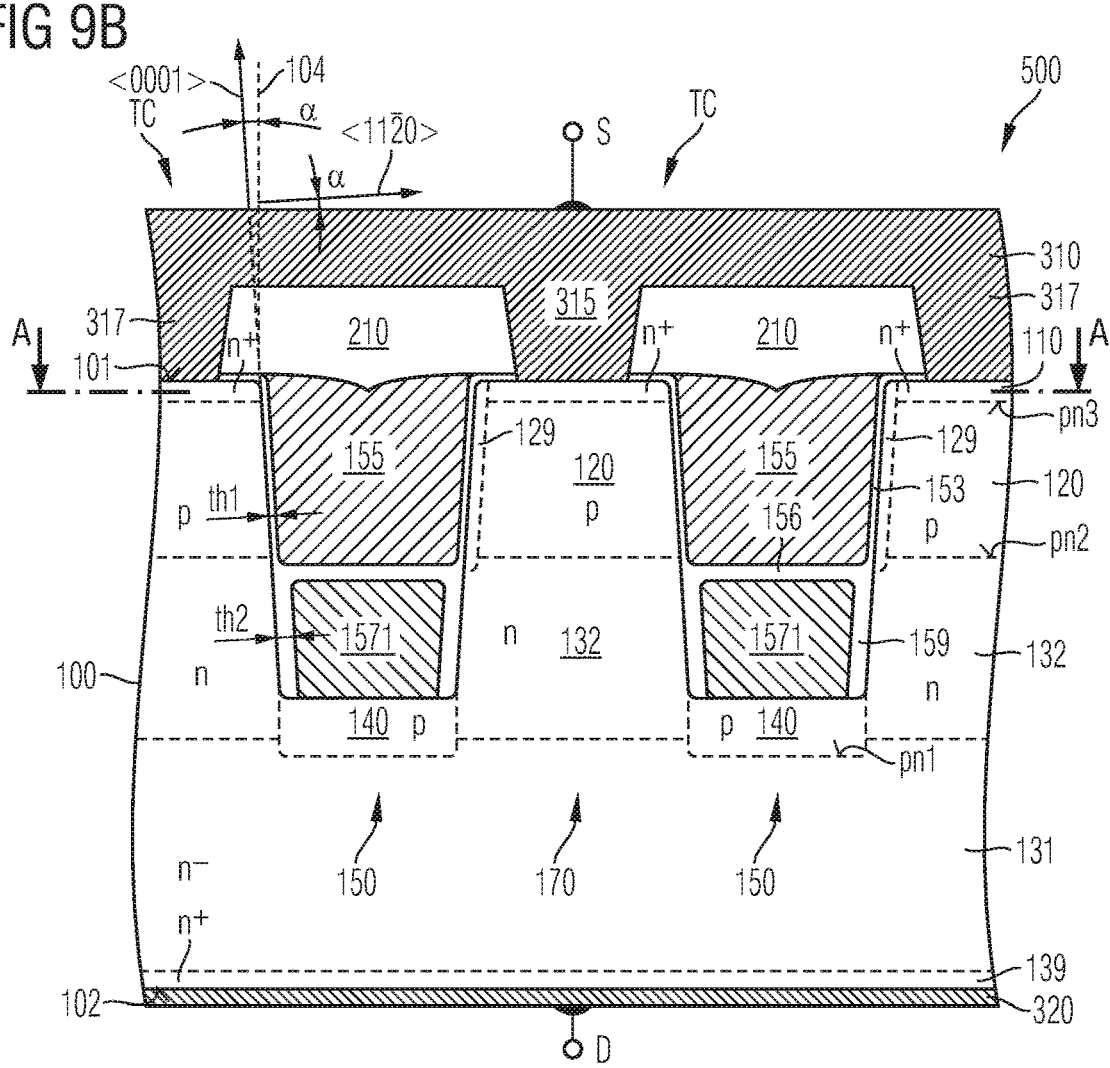
FIG. 9B is a schematic vertical cross section through the semiconductor device section from FIG. 9A along the line B-B.
Figure 9C:
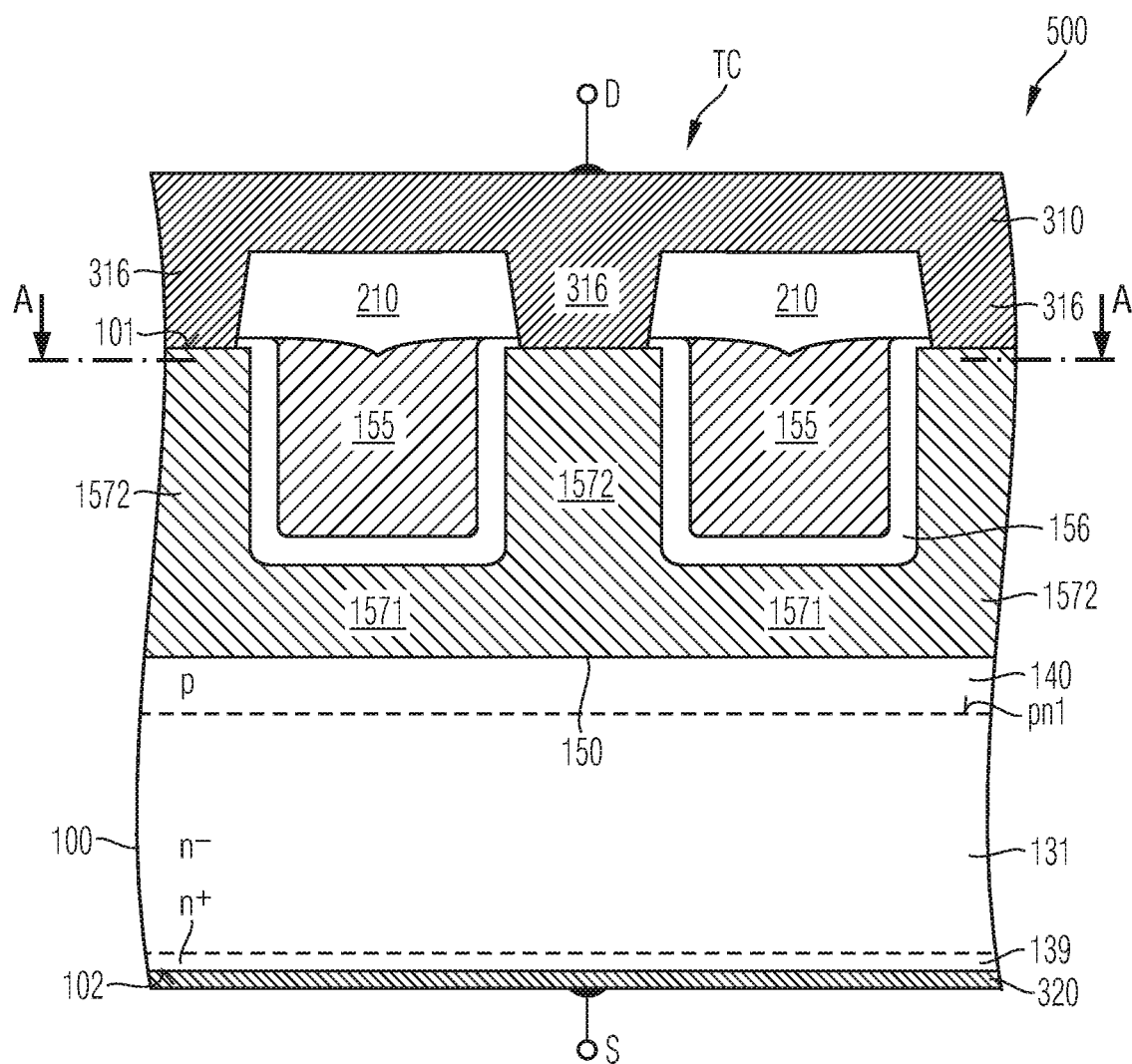
FIG. 9C is a schematic vertical cross section through the semiconductor device section from FIG. 9A along the line C-C.

In FIGS. 9A to 9C, the <0001> lattice direction is tilted relative to the normal 104 to the first surface 101 by an angle deviation α. The lateral first direction 191 is parallel to the <1-100> lattice direction. In accordance with the embodiment illustrated, transistor cells TC are formed in each case only on one side of the trench structure 150. On the inactive side, the formation of a transistor channel can be suppressed for example by a channel inhibition region 129 as described in association with FIGS. 4A to 4D or by a section of a field dielectric 159 as described in association with FIG. 7.

Figure 10A:
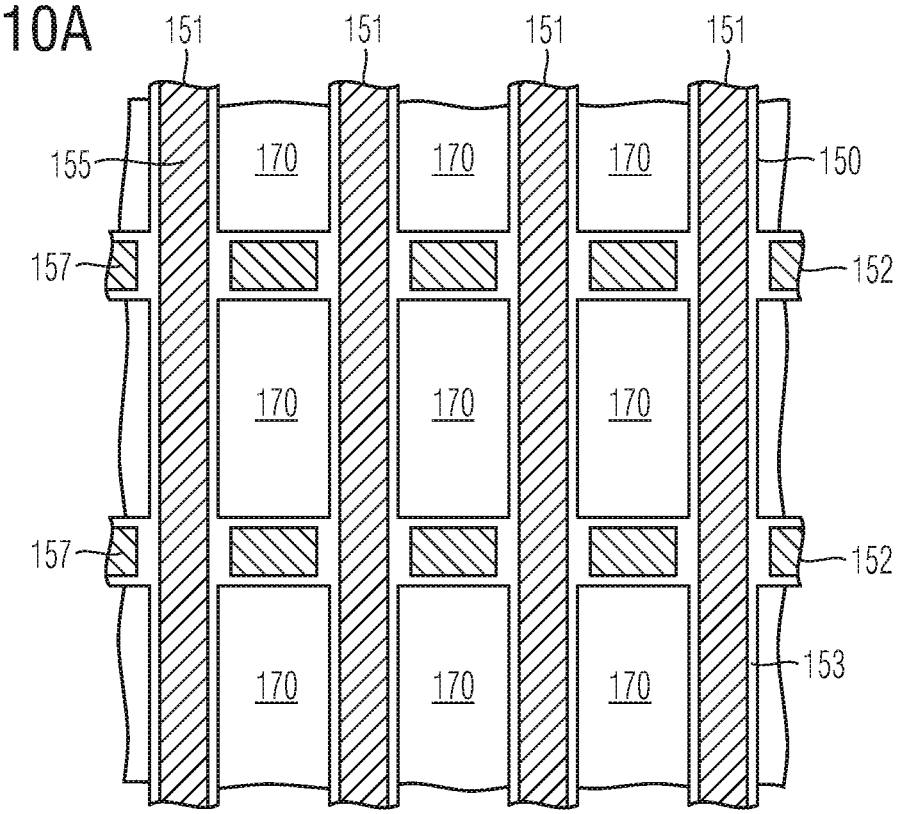
FIG. 10A is a schematic horizontal cross section through a section of a semiconductor device in accordance with one embodiment comprising connection regions for an electrode connected to a shielding region, said connection regions being arranged in columns and rows.

FIG. 10A shows mesa sections 170 arranged in rows extending along the first direction 191 and in columns orthogonal to the rows. Along the first direction 191, second sections 152 of the trench structure 150 separate adjacent mesa sections 170 from one another. Orthogonal to the first direction 191, first sections 151 of the trench structure 150 separate adjacent mesa sections 170 from one another.

Figure 10B:
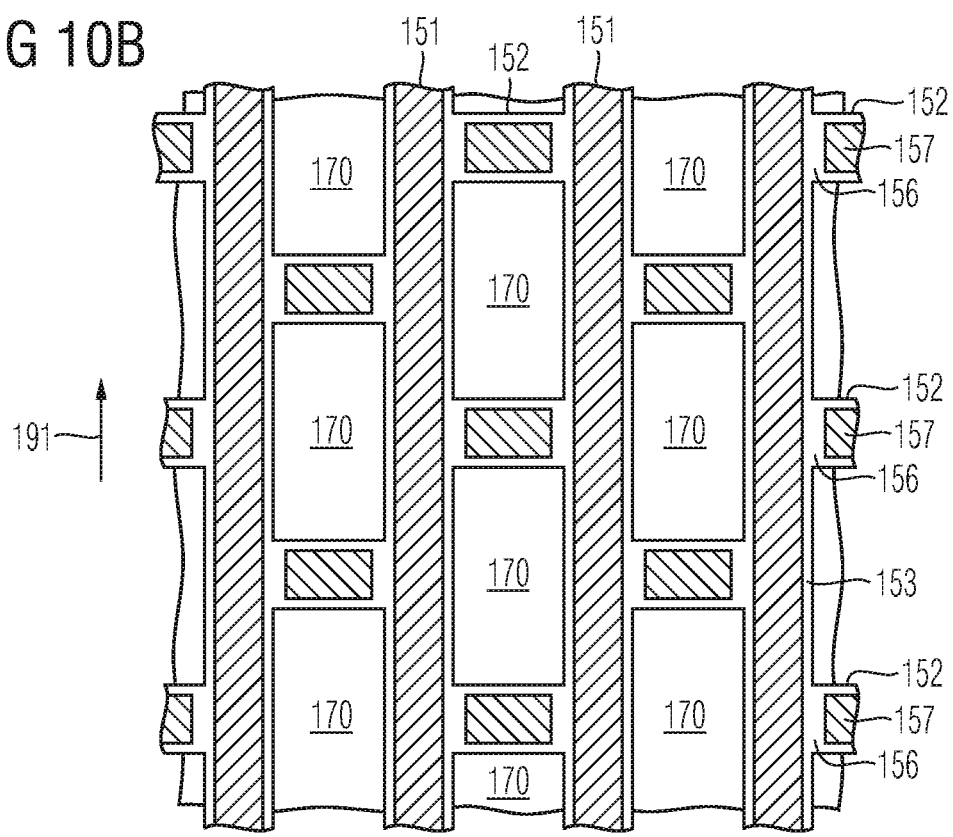
FIG. 10B is a schematic horizontal cross section through a section of a semiconductor device in accordance with a further embodiment comprising connection regions for an electrode connected to a shielding region, said connection regions being arranged in rows offset relative to one another.

In FIG. 10B, two adjacent rows are offset relative to one another in each case by half a center-to-center distance between two adjacent second sections 152 of the trench structure 150 of the same row.

Figure 11:
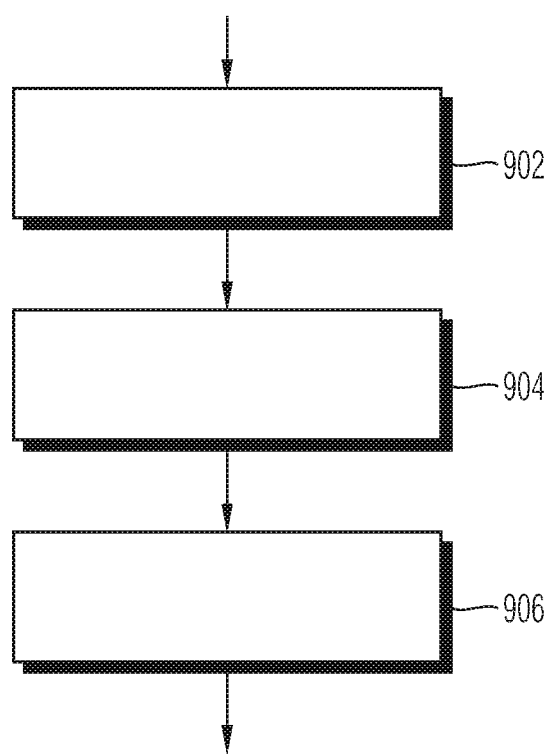
FIG. 11 is a simplified schematic flow diagram for a method for producing a semiconductor device in accordance with a further embodiment.

In accordance with FIG. 11, a method for producing an SiC semiconductor device comprising transistor cells comprises providing a semiconductor substrate comprising silicon carbide, wherein a trench extends into the semiconductor substrate from a first main surface. The trench comprises first trench sections having a longitudinal extent along a lateral first direction and second trench sections connecting the first trench sections to one another without interrupting them. The trench exposes a shielding region, which forms a first pn junction with a drift structure (902). An electrode is formed in the second trench sections and also in a lower region of the first trench sections (904). A gate electrode is formed in an upper region of the first trench sections (906).

The method enables a low-impedance connection of the electrode formed at the bottom of the trench to a load electrode to be provided above the first main surface, without the gate electrode being interrupted in the longitudinal direction for this purpose.

FIGS. 12A to 15C relate to a method for producing a semiconductor device on the basis of a silicon carbide substrate 700, which for example comprises or consists of a silicon carbide crystal, wherein the silicon carbide substrate 700 can comprise doping atoms and impurities, e.g. hydrogen and/or oxygen, besides the main constituents of silicon and carbon. The crystal type of the crystalline silicon carbide substrate 700 can be a 4H polytype. The silicon carbide substrate 700 can comprise for example a heavily doped base substrate 705, wherein the base substrate 705 can be a silicon carbide wafer that was sliced from a monocrystalline silicon carbide crystal by means of sawing, for example. The base substrate 705 can be heavily doped, for example heavily n-doped. A drift layer structure 730, which can form a unipolar junction with the base structure 705, can be formed on a process surface of the base substrate 705, for example by means of an epitaxial method. The drift layer structure 730 can be uniformly doped or comprise at least two or three partial layers having different dopant concentrations.

A body layer 720 can be formed on a main surface of the drift layer structure 730 opposite the base substrate 705, said body layer having a conductivity type opposite to the conductivity type of the drift layer structure 730. The body layer 720 can for example be grown on the drift layer structure 730 by means of epitaxy or be formed by introducing dopant into an upper section of the drift layer structure 730. A source layer 710 of the conductivity type of the drift layer structure 730 can be formed on the body layer 720, for example by growing silicon carbide on the body layer 720 or by introducing dopant into an upper section of the body layer 720. The body layer 720 and/or the source layer 710 can also be formed at a later point in time. The formation of body layer 720 and source layer 710 can be suppressed locally in regions which are provided for example for forming sections of a Schottky contact.

A mask layer can be applied on a process surface 701 of the silicon carbide substrate 700. A photolithographic method forms a trench mask 790 from the mask layer. In the vertical projection of an opening 792 in the trench mask 790, a trench 750 is formed in the silicon carbide substrate 700, for example by means of an anisotropic etching method.

Figure 12A:
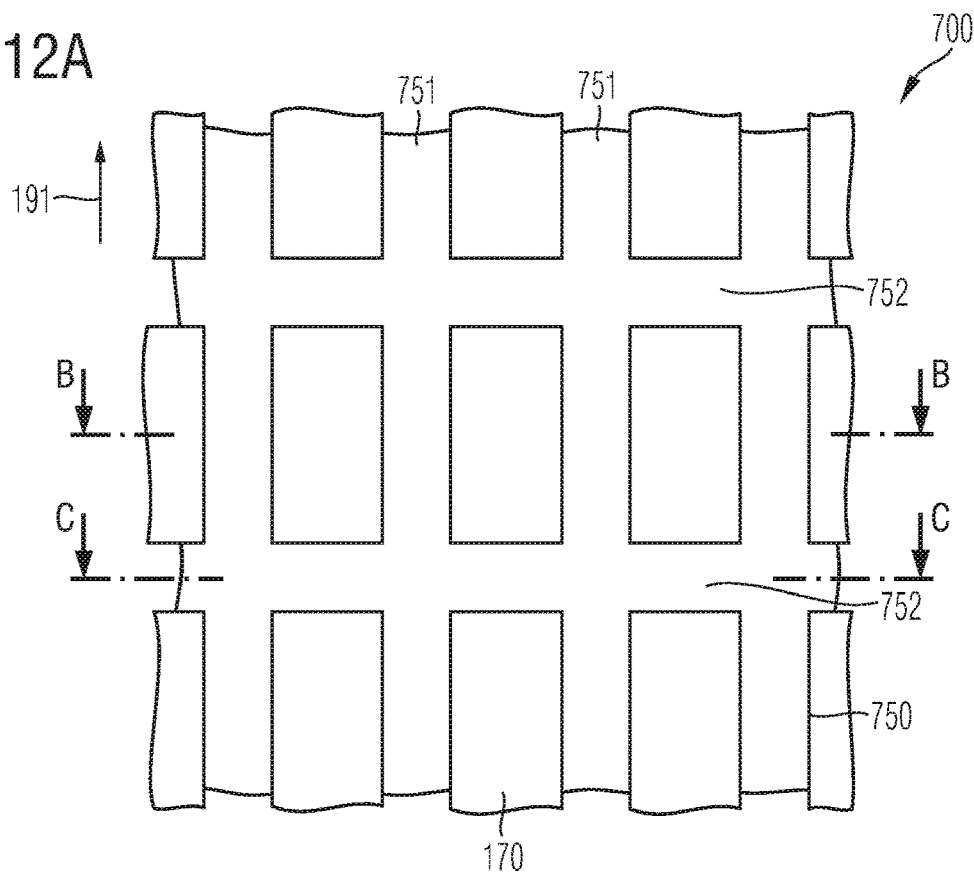
FIGS. 12A to 12C show a horizontal and two vertical cross sections through a section of a semiconductor substrate for illustrating a method for producing a semiconductor device in accordance with a further embodiment, after forming a trench.

FIG. 12A shows that the trench 750 can form a lattice, wherein the trench 750 comprises continuous first trench sections 751 having a longitudinal extent along a lateral first direction 191 and second trench sections 752 extending transversely, for example orthogonally, to the first trench sections 751 and connecting adjacent first trench sections 751. Mesa sections 170 of the silicon carbide substrate 700 are formed in the meshes of the lattice formed by the trench 750.

Figure 12B:
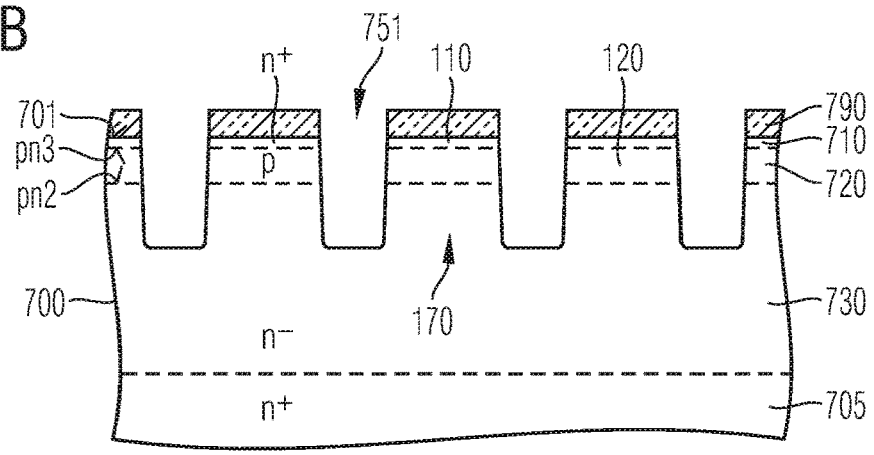
Figure 12C:
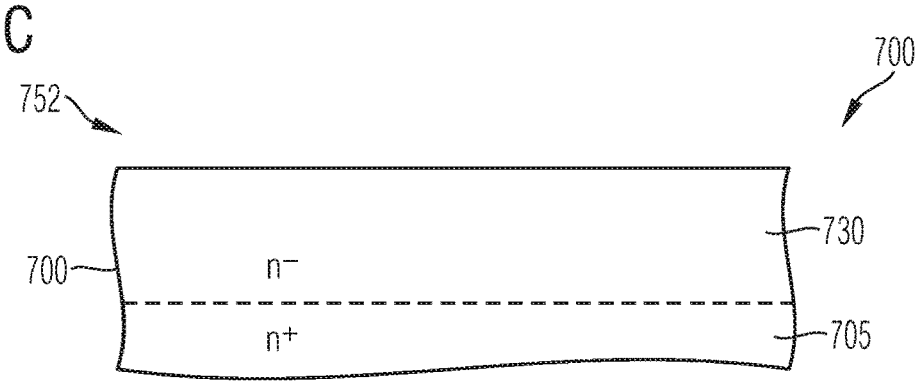

As shown by FIG. 12B, the trench 750 can extend through the source layer 710 and the body layer 720 right into the drift layer structure 730. Sections of the body layer 720 in the mesa sections 170 form body regions 120, which form second pn junctions pn2 with the drift layer structure 730 and third pn junctions pn3 with source regions 110 formed from sections of the source layer 710. With regard to the shape and dimensioning of the first and second trench sections 751, 752, reference is made to the shape and dimensioning of the trench structures 150 illustrated in the previous figures.

Through the bottom of the trench 750, atoms of a dopant of a conductivity type opposite to the conductivity type of the drift layer structure 730 can be introduced into the silicon carbide substrate 700, wherein the trench mask 790 can be effective at least as part of an implantation mask.

Before or after introducing the dopant through the bottom of the trench, dielectric spacer structures (spacers) 759 can be formed at least at the sidewalls of the mesa sections 170. The formation of the dielectric spacers 759 can comprise the deposition of one or more dielectric materials, a thermal oxidation of the silicon carbide substrate 700 or a combination of both. Dielectric material that is formed along the bottom of the trench is removed, for example by means of an anisotropic etch that selectively removes lateral sections of a dielectric layer formed previously.

Figure 13A:
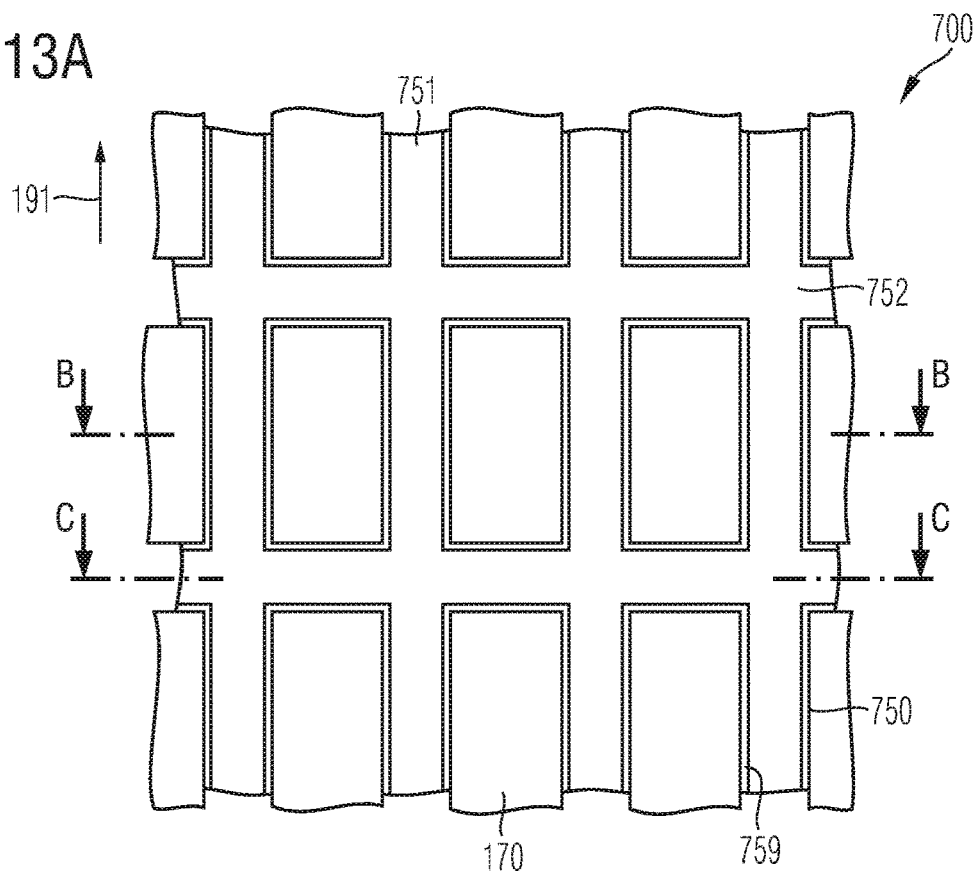
FIGS. 13A to 13C show a horizontal and two vertical cross sections through the substrate section according to FIGS. 12A to 12C, after forming dielectric spacer structures in the trench.
Figure 13B:
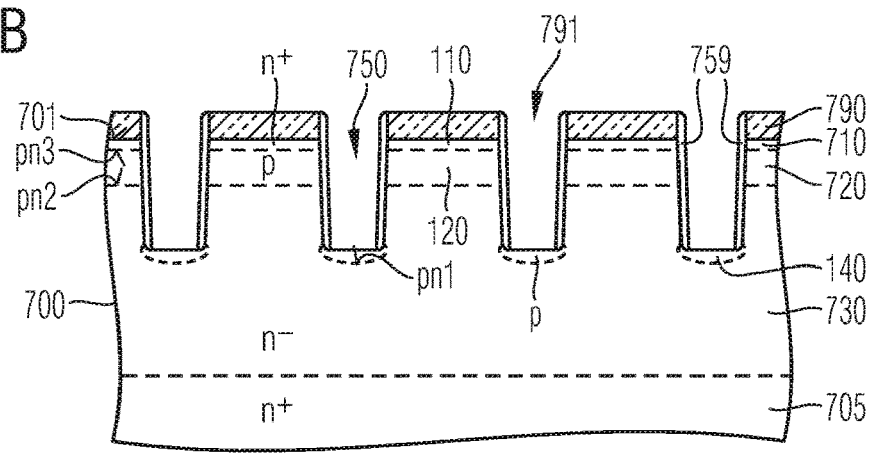
Figure 13C:
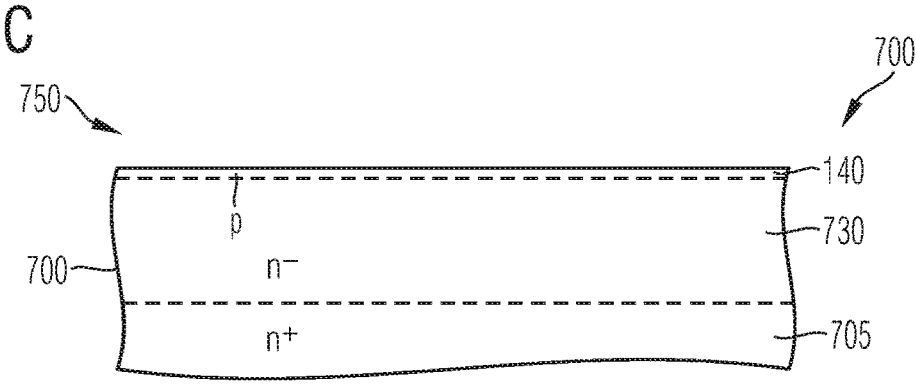

FIGS. 13A to 13C show the dielectric spacers 759 which are formed along the sidewalls of the mesa sections 170 and completely cover the latter. Below the trench 150, the dopant introduced through the bottom of the trench defines a shielding region 140.

Afterward, a conductive electrode 157 is formed, which completely fills a lower region of the first trench sections 751 and the second trench sections 752.

By way of example, forming the electrode 157 comprises depositing a first conductive material, which completely fills the trench 750. An etching mask layer can then be deposited and patterned photolithographically, wherein an etching mask 795 is formed from the etching mask layer and exposes first sections of the first conductive material in the first trench sections 751 and covers second sections of the first conductive material in at least central sections of the second trench sections 752. With the etching mask 795 emplaced, the first sections of the first conductive material in the first trench sections 751 are selectively caused to recede. The first conductive material can comprise heavily doped polycrystalline silicon, for example. Before or after depositing the polycrystalline silicon, it is possible to deposit a metal, a metal compound or a metal alloy, for example a metal, which subsequently at least partly silicides.

Figure 14A:
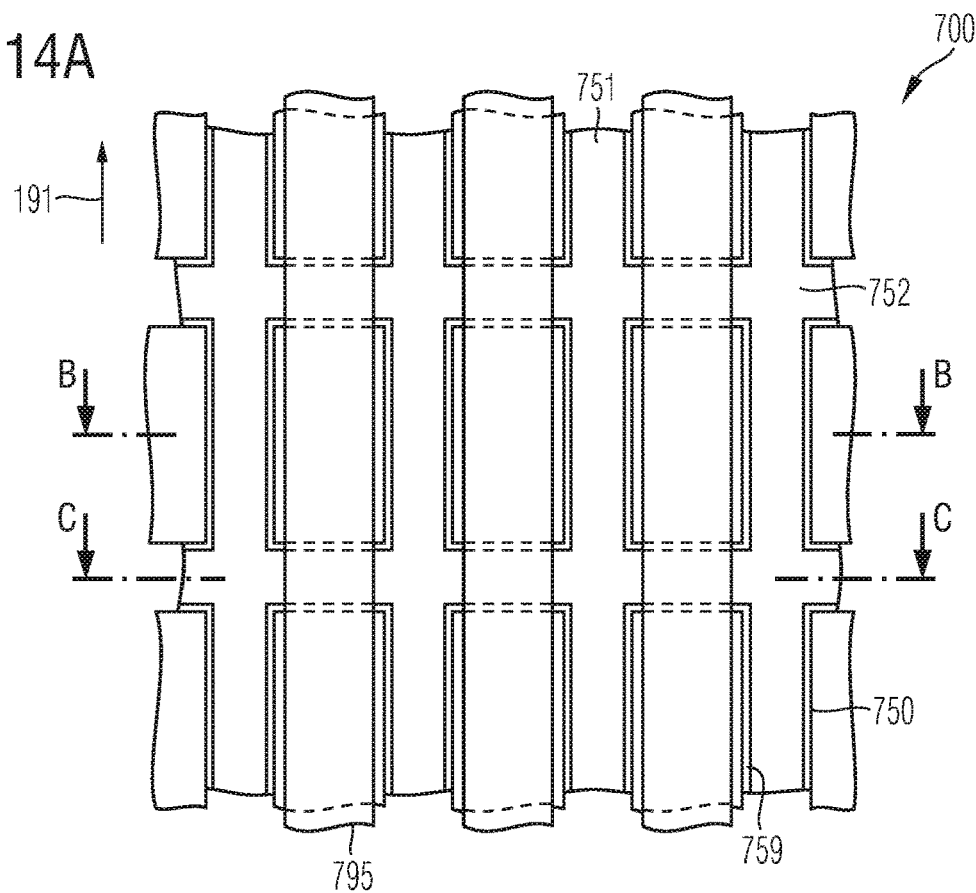
FIGS. 14A to 14C show a horizontal and two vertical cross sections through the substrate section according to FIGS. 13A to 13C after forming an electrode in the trench.

FIG. 14A shows the etching mask 795, which can comprise strip-like structures and which largely covers the second trench sections 752 and largely exposes the first trench sections 751.

Figure 14B:
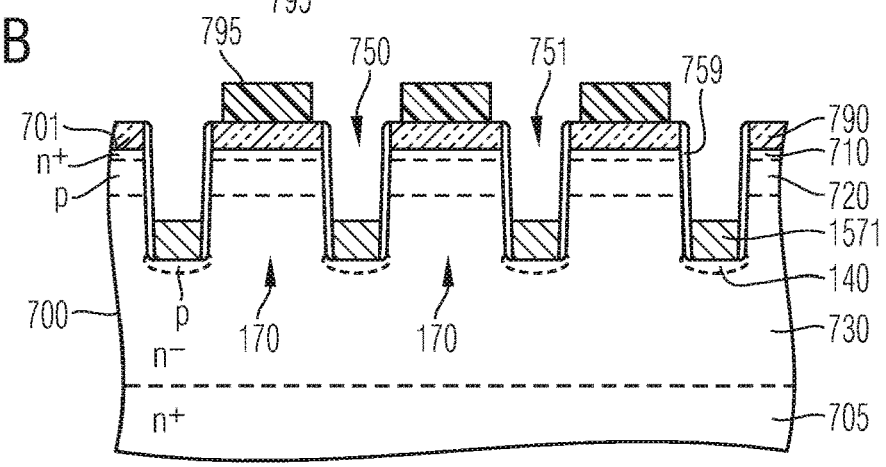

FIG. 14B shows the first conductive material selectively caused to recede in the first trench sections 751, which material forms an electrode 157.

Figure 14C:
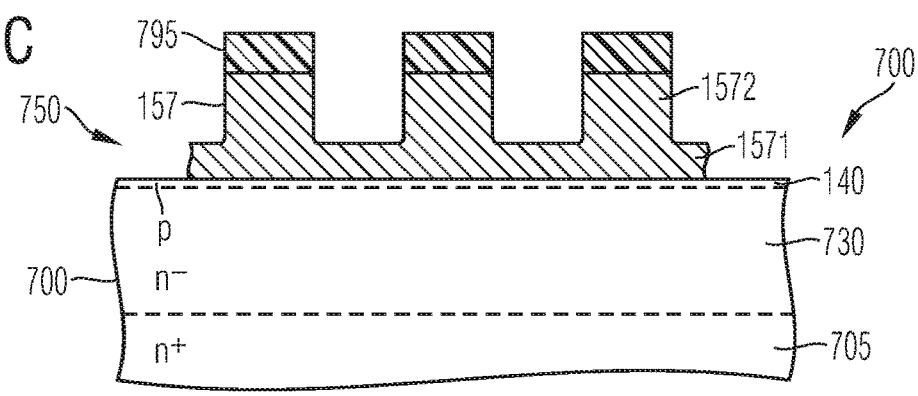

FIG. 14C shows the electrode 157 having a main section 1571 in the first trench sections 751 and having connection sections 1572 completely filling the second trench sections 752.

Sections of the dielectric spacers 759 in the upper region of the first trench sections 751 can be completely or partly removed, for example by a process that uses the electrode 157 as part of the etching mask. A remaining section of the dielectric spacers 759 forms a field dielectric 159, which separates the electrode 157 at least from the drift structure layer 730.

A separating dielectric 156 can be formed on exposed areas of the electrode 157. Forming the separating dielectric 156 can comprise for example an oxidation process, the process parameters of which are set such that the oxidation rate is significantly higher on polycrystalline silicon than on monocrystalline silicon carbide. The separating dielectric 156 can be formed before or after removing exposed sections of the dielectric spacers 759.

The etching mask 795 and the trench mask 790 can be removed. A gate dielectric layer 753 can be formed, for example by depositing silicon oxide and densifying the deposited silicon oxide by means of a thermal treatment. Forming the gate dielectric layer 753 can also comprise adding nitrogen into a deposited silicon oxide layer. A second conductive material, for example heavily doped polycrystalline silicon, is deposited, wherein an upper section of the trenches 750 can be filled.

Figure 15A:
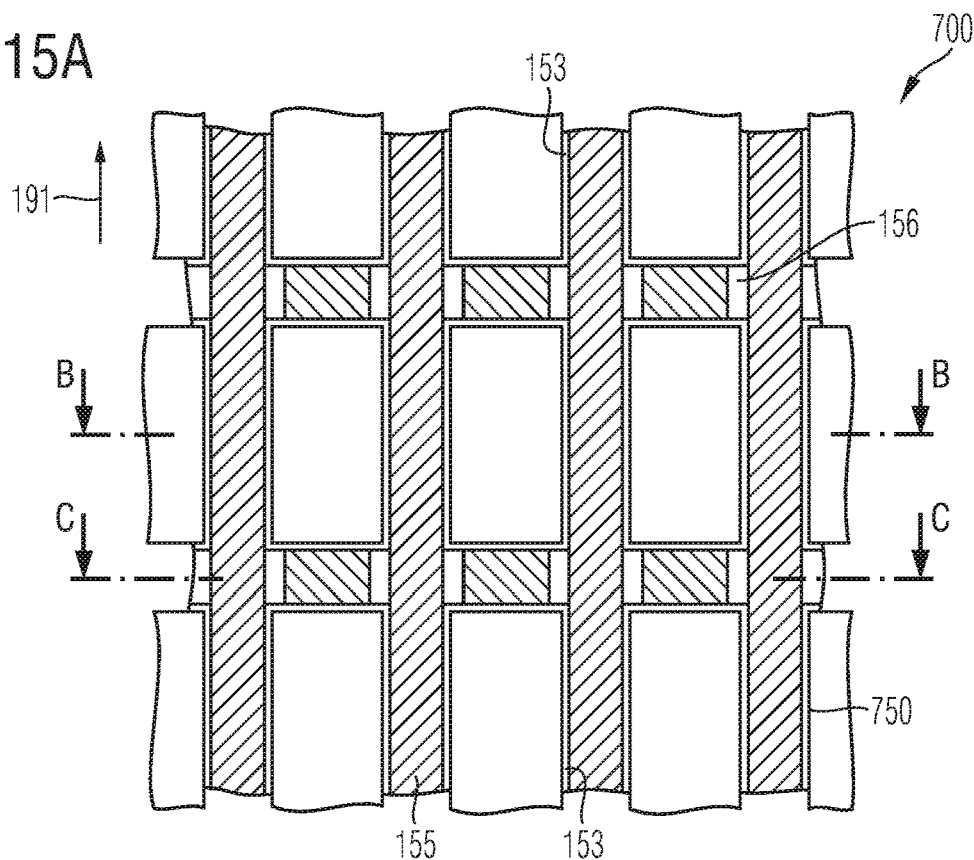
FIGS. 15A to 15C show a horizontal and two vertical cross sections through the substrate section according to FIGS. 14A to 14C after forming a gate electrode.
Figure 15B:
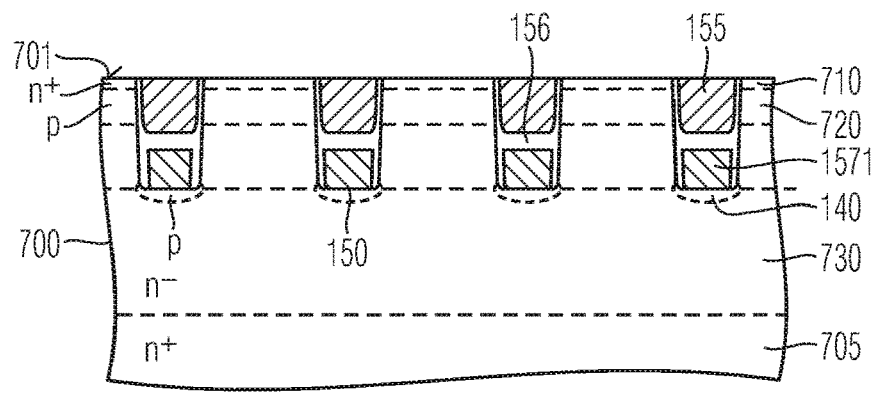
Figure 15C:
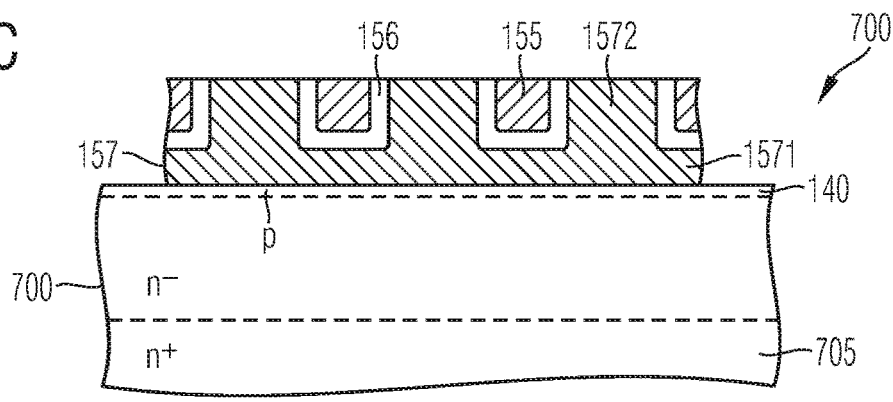

FIGS. 15A to 15C show a gate electrode 155 that emerged from the second deposited material in the upper region of the first trench sections 751.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
 a trench structure extending from a first surface into a semiconductor body composed of silicon carbide, the trench structure comprising an electrode and a gate electrode, the gate electrode being positioned between the electrode and the first surface;
 a shielding region formed in the semiconductor body, the shielding region adjoining the electrode and forming a first pn junction with a drift structure; and
 a Schottky contact formed between the drift structure and a first contact structure,
 wherein the shielding region contacts the electrode at a bottom of the trench structure.

2. The semiconductor device of claim 1, wherein the first contact structure and the shielding region are connected to a first load electrode via low-impedance paths.

3. The semiconductor device of claim 1, wherein the shielding region is formed below the electrode.

4. The semiconductor device of claim 1, wherein sections of the Schottky contact are formed between adjacent sections of the trench structure.

5. The semiconductor device of claim 1, wherein the Schottky contact is formed at a vertical distance from the first surface, and wherein the vertical distance is less than a vertical distance between a lower edge of the shielding region and the first surface.

6. The semiconductor device of claim 1, wherein the electrode comprises a connection region extending from the first surface as far as a bottom of the trench structure.

7. The semiconductor device of claim 6, wherein sections of the gate electrode and connection regions of the electrode alternate along a lateral longitudinal extent of the trench structure.

8. The semiconductor device of claim 1, wherein the trench structure comprises first sections and second sections, wherein the first sections extend along a lateral first direction, wherein the second sections respectively connect two of the first sections which are adjacent along a lateral second direction orthogonal to the first direction, and wherein the gate electrode is formed in the first sections and second contact structures adjoin the electrode in the second sections.

9. The semiconductor device of claim 8, wherein the first sections and the second sections of the trench structure laterally enclose first mesa sections and second mesa sections of the semiconductor body, wherein the first mesa sections comprise body regions and the body regions form second pn junctions with the drift structure, and wherein sections of the Schottky contact are formed in the second mesa sections.

10. The semiconductor device of claim 9, further comprising:
    third contact structures adjoining the body regions,
    wherein the first contact structure and the third contact structures extend in the semiconductor body.

11. The semiconductor device of claim 9, further comprising:
    third contact structures adjoining the body regions,
    wherein the first contact structure and the third contact structures are formed on the first surface.

12. The semiconductor device of claim 9, further comprising:
    source regions formed between the first surface and the body regions,
    wherein the body regions form third pn junctions with the source regions,
    wherein the body regions and the source regions adjoin the first surface alternately along the first direction.

13. The semiconductor device of claim 9, further comprising:
    third contact structures adjoining the body regions,
    wherein the first contact structure and the third contact structures are connected to a first load electrode.

14. The semiconductor device of claim 9, wherein the first contact structure and the second contact structures form sections of contact strips, and wherein the contact strips extend along the first direction and adjoin at least a second mesa section and a section of the electrode.

15. The semiconductor device of claim 9, further comprising:
    third contact structures adjoining the body regions,
    wherein the first contact structure and the third contact structures form sections of contact strips,
    wherein the contact strips extend along the first direction and adjoin at least a first mesa section and a section of the electrode.

16. The semiconductor device of claim 1, wherein the drift structure comprises at least one drift zone and diode regions, wherein the drift zone is formed between the shielding regions and a second surface of the semiconductor body situated opposite the first surface, wherein the diode regions extend from the first contact structures as far as the drift zone, and wherein an average dopant concentration in the diode regions is at least double the magnitude of an average dopant concentration in the drift zone.

17. A semiconductor device, comprising:
    a trench structure extending from a first surface into a semiconductor body composed of silicon carbide, the trench structure comprising:
        first sections and second sections, the first sections extending along a lateral first direction, the second sections respectively connecting two of the first sections which are adjacent along a lateral second direction orthogonal to the first direction;
        an electrode and between the electrode and the first surface a gate electrode formed in the first sections; and
        connection regions of the electrode connected to a first load electrode in the second sections; and
    a shielding region adjoining the electrode and forming a first pn junction with a drift structure in the semiconductor body,
    wherein the shielding region contacts the electrode at a bottom of the trench structure.

18. The semiconductor device of claim 17, wherein the shielding region is formed between the electrode and a second surface of the semiconductor body situated opposite the first surface.

19. The semiconductor device of claim 17, wherein the first and second sections of the trench structure laterally enclose mesa sections of the semiconductor body, wherein the mesa sections comprise body regions which form second pn junctions with the drift structure and third pn junctions with source regions, and wherein the source regions are formed between the first surface and the body regions.

20. The semiconductor device of claim 17, wherein the electrode extends in the second sections of the trench structure as far as the first surface.

21. The semiconductor device of claim 17, further comprising:
    contact structures connecting the first load electrode to the connection regions of the electrode.

22. A method for producing a semiconductor device, the method comprising:
    providing a semiconductor substrate composed of silicon carbide, into which a trench extends from a first main surface, the trench comprising first trench sections having a longitudinal extent along a lateral first direction and second trench sections connecting the first trench sections to one another, the trench exposing a shielding region which forms a first pn junction with a drift structure;
    forming an electrode filling the second trench sections and a lower region of the first trench sections; and
    forming a gate electrode in an upper region of the first trench sections.

23. The method of claim 22, wherein the shielding region contacts the electrode at a bottom of the trench structure.

* * * * *